(12) United States Patent
Ahmed et al.

(10) Patent No.: US 10,186,676 B2
(45) Date of Patent: Jan. 22, 2019

(54) EMISSIVE DEVICES FOR DISPLAYS

(71) Applicant: Intel Corporation, Santa Clara, CA (US)

(72) Inventors: Khaled Ahmed, Anaheim, CA (US); Ali Khakifirooz, Los Altos, CA (US); Richmond Hicks, Aloha, OR (US)

(73) Assignee: Intel Corporation, Santa, Clara, CA (US)

(\*) Notice: Subject to any disclaimer, the term of this patent is extended or adjusted under 35 U.S.C. 154(b) by 0 days.

(21) Appl. No.: 15/918,893

(22) Filed: Mar. 12, 2018

(65) Prior Publication Data

US 2018/0261785 A1 Sep. 13, 2018

Related U.S. Application Data

(60) Provisional application No. 62/470,789, filed on Mar. 13, 2017.

(51) Int. Cl.
*H01L 27/32* (2006.01)
*H01L 51/50* (2006.01)
(Continued)

(52) U.S. Cl.
CPC .......... *H01L 51/508* (2013.01); *G02B 6/2706* (2013.01); *G02B 6/3516* (2013.01); *G02B 27/0172* (2013.01); *G02B 27/0176* (2013.01); *G02B 27/10* (2013.01); *G06F 3/011* (2013.01); *H01L 27/323* (2013.01); *H01L 27/326* (2013.01); *H01L 27/3211* (2013.01); *H01L 33/24* (2013.01); *H01L 51/5012* (2013.01); *H01L 51/5064* (2013.01); *H01L 51/56* (2013.01); *H01S 5/183* (2013.01); *G02B 2027/0174* (2013.01); *G02B 2027/0178* (2013.01)

(58) Field of Classification Search
CPC ............ H01L 51/5128; H01L 51/5262; H01L 51/5265; H01L 51/5268; H01L 51/5271; H01L 33/405; H01L 33/46; H01L 33/58; H01L 33/60; H01L 51/5072; H01L 27/326; H01L 33/24; H01S 5/183; G02B 6/3516; G02B 27/0172; G02B 27/10
See application file for complete search history.

(56) References Cited

U.S. PATENT DOCUMENTS

| 9,806,127 | B1 * | 10/2017 | Ahmed | ................ | H01L 27/156 |
| 2010/0176375 | A1 * | 7/2010 | Lochtefeld | ........ | H01L 21/02381 257/14 |
| 2012/0061646 | A1 * | 3/2012 | Yi | ........................ | H01L 33/24 257/13 |

\* cited by examiner

*Primary Examiner* — Victoria K Hall
(74) *Attorney, Agent, or Firm* — Green, Howard, & Mughal LLP

(57) ABSTRACT

Embodiments related to emissive devices for displays are discussed. Some embodiments include light emitting diodes including an electron transport layer core having a tube shape with an inner and an outer sidewall, an emission layer on the inner and outer sidewalls, and a hole transport layer on the emission layer, displays and systems including such light emitting diodes, and methods for fabricating them. Other embodiments include emissive laser devices having an emission layer between a hole transport layer and an electron transport layer and first and second metasurface mirrors adjacent to the hole transport layer and the electron transport layer, respectively, displays and systems including such emissive laser devices, and methods for fabricating them.

15 Claims, 19 Drawing Sheets

(51) Int. Cl.
   *H01L 51/56* (2006.01)
   *G02B 6/27* (2006.01)
   *G02B 6/35* (2006.01)
   *G02B 27/10* (2006.01)
   *G06F 3/01* (2006.01)
   *H01S 5/183* (2006.01)
   *H01L 33/24* (2010.01)
   *G02B 27/01* (2006.01)

EMISSIVE DEVICES FOR DISPLAYS

CLAIM OF PRIORITY

This Application is a Non-Provisional of, and claims priority to, U.S. Provisional Patent Application No. 62/470,789, filed 13 Feb. 2017 and titled "EMISSIVE DEVICES FOR DISPLAYS", which is incorporated by reference in its entirety for all purposes.

BACKGROUND

Display technology for devices such as wearable devices (e.g., watches, augmented reality devices, virtual reality devices) or display devices of mobile or stationary devices is an emerging technology area. Such devices may require red-green-blue (RGB) colors (e.g., full color), high brightness (e.g., more than 2,000 cd/m$^2$), high contrast, low power, high pixel densities (e.g., more than 2,500 pixels per inch), and low manufacturing costs to provide high quality products for users.

As such, there is a continual demand for improved emissive micro LED devices and emissive laser devices, systems including such emissive devices, and fabrication techniques for forming them. It is with respect to these and other considerations that the present improvements have been needed. Such improvements may become critical as the desire to provide high quality displays in a variety of devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
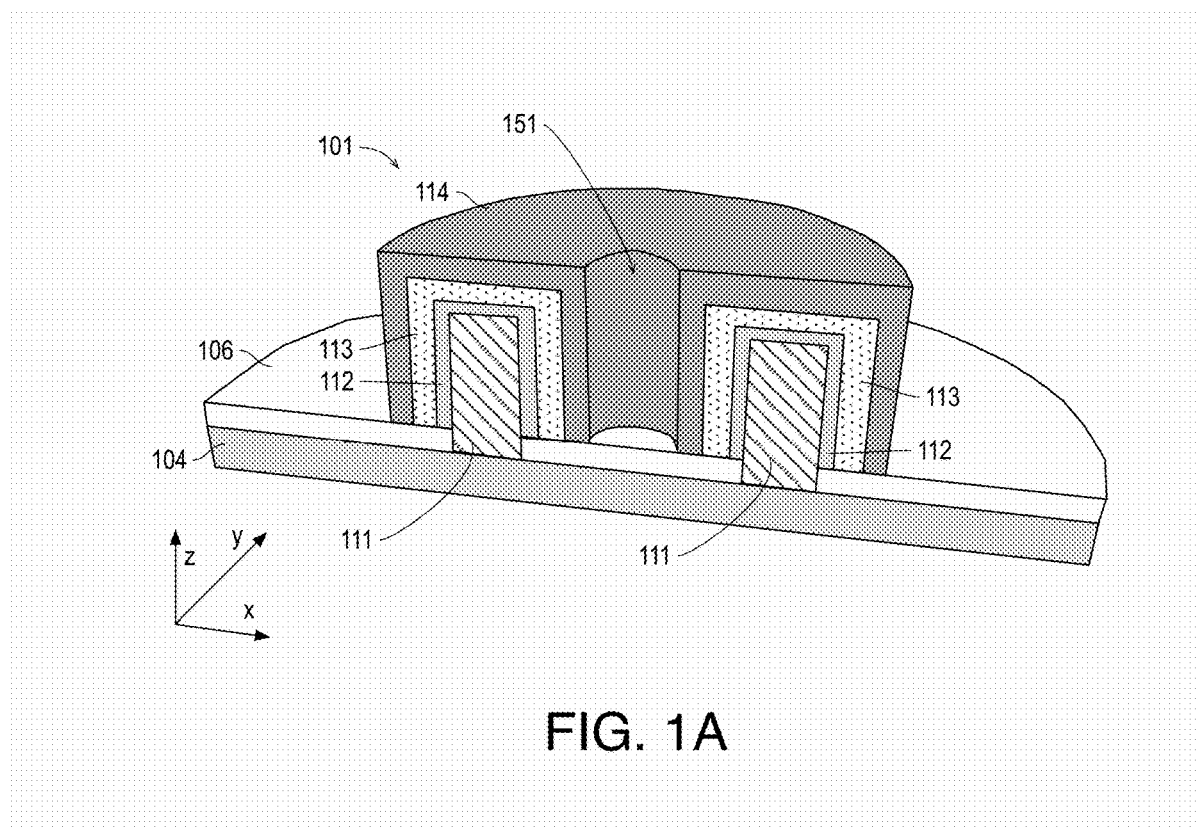
FIG. 1A is a 3-dimensional view of an example micro light emitting diode that has been cross-sectioned.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers.

In contrast, a first layer "immediately adjacent to" or "on" a second layer is in direct contact with that second layer. Similarly, unless explicitly stated otherwise, one feature disposed between two features may be in direct contact with the adjacent features or may have one or more intervening features.

Micro light emitting diodes, integrated circuits, devices, apparatuses, computing platforms, and methods are described below related micro tube light emitting diodes. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In some embodiments discussed herein, a light emitting diode device includes a tube shape electron transport layer core having an inner sidewall and an outer sidewall. For example, the electron transport layer core (e.g., n-doped gallium nitride) may have a substantially tube or ring shape or annular shape such that the inner sidewall is continuous and around a center of the tube shape and the outer sidewall is continuous and around the inner sidewall. The light emitting diode device includes an emission layer (e.g., a multiple quantum well having alternating layers of indium gallium nitride and gallium nitride) on both the inner and outer sidewalls as well as a top surface of the electron transport layer core and a hole transport layer (e.g., p-doped gallium nitride) on the emission layer. The light emitting diode device may include a reflective cladding over the hole transport layer. For example, the emission layer may wrap around the electron transport layer core, the hole transport layer may wrap around the emission layer, and the reflective cladding may wrap around the hole transport layer and cover the other layers of the structure. Furthermore, electrodes may provide coupling to the light emitting diode device such that, in operation, the light emitting diode device may emit a band of light.

Such a configuration of the light emitting diode device, with the electron transport layer core having a tube or ring or annular shape and with an emission layer over sidewalls of the electron transport layer core and a hole transport layer over the emission layer may provide advantages such as increased emitting surface area contact between adjacent layers, increased operating efficiency, and reduced footprint. As will be appreciated, light-producing recombination in the device occurs in the emission layer. The devices discussed herein may advantageously be formed without etching the emission layer (e.g., alternating layers of indium gallium nitride and gallium nitride), which would cause damage to such layers that cause defects that reduce power efficiency due to non-radiative recombination of electrons and holes at the defects.

As is discussed further herein, in some embodiments, second and third light emitting diode devices to emit different bands of light may also be provided such that a red-green-blue display device is provided. Such RGB micro LED devices may be assembled from red, green, and blue micro light emitting diodes manufactured separately (e.g., fabricated on separate carriers and subsequently assembled using pick and place techniques or the like) or such RGB micro LED devices may be manufactured on the same substrate or carrier or the like by providing selective dimensions of the devices as is discussed further herein. Such micro LEDs on the same substrate or carrier may then be directly bonded to a driver circuit back plane or wafer or the like using direct bonding techniques.

In another embodiment, a system may include a processor, a display device having a light emitting diode devices as discussed herein, and other components such as a wireless transceiver or the like. Such a system may be provided in any suitable form factor device such as a watch, an augmented reality device, a virtual reality device, a headset, a mobile device such as a smartphone, a tablet, a laptop, a phablet (e.g., a 5 inch side display), or as a discrete display device.

Figure 1B:
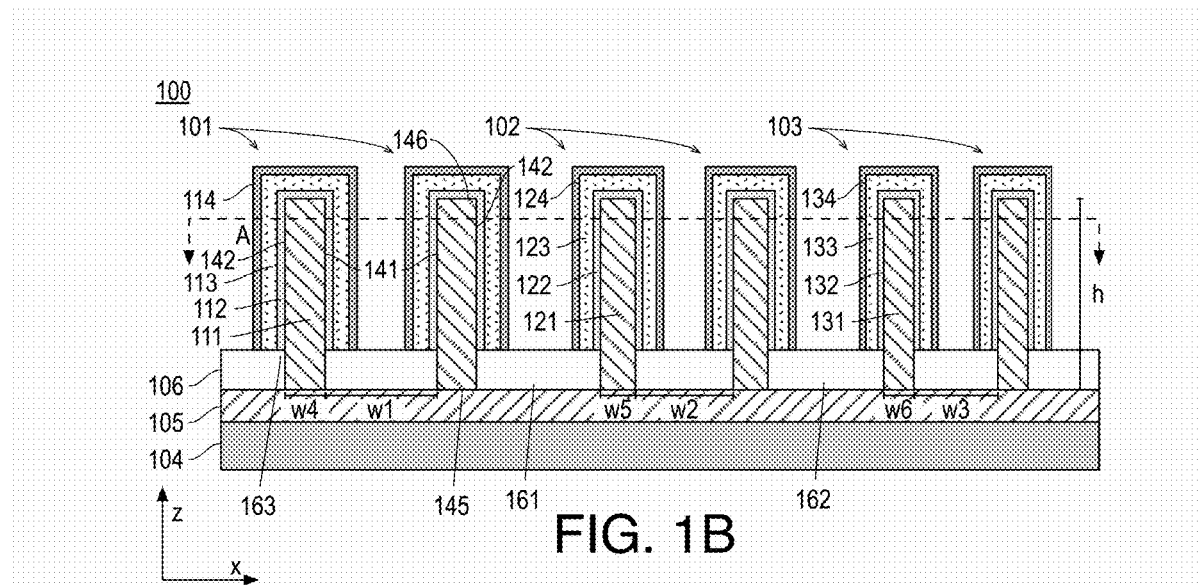
FIG. 1B is a cross-sectional view of example light emitting diode structure including example micro light emitting diodes.
Figure 1C:
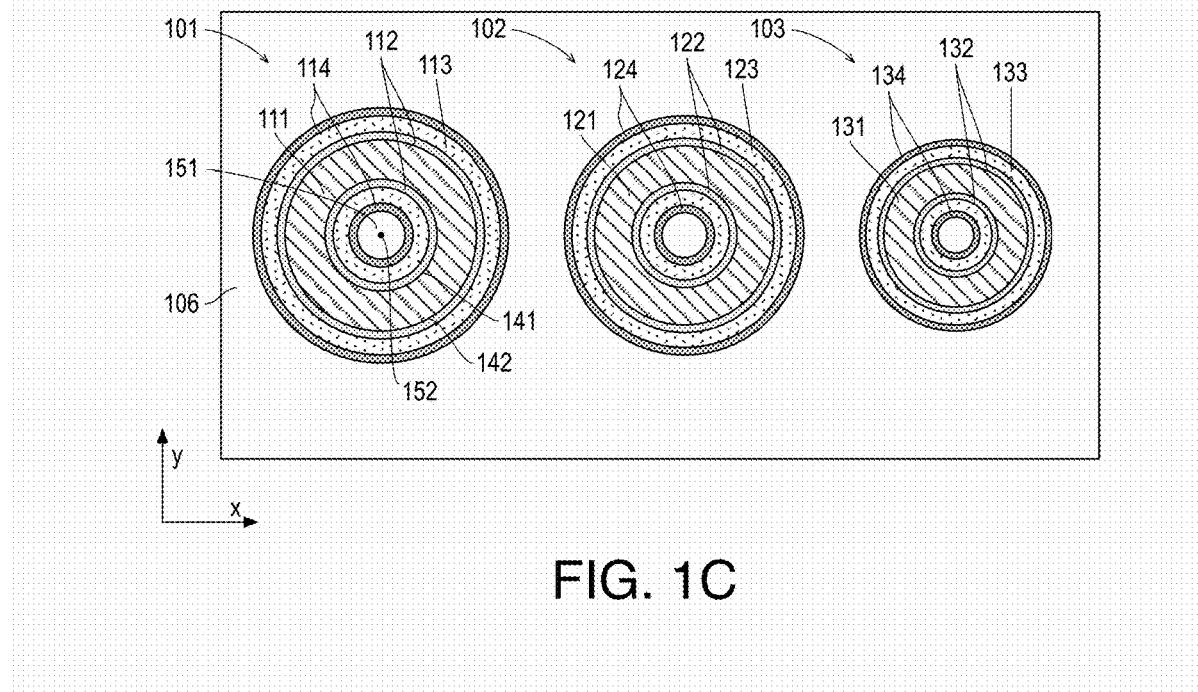
FIG. 1C is a plan view of the example light emitting diode structure of FIG. 1B.

FIG. 1A is a 3-dimensional view of an example micro light emitting diode 101 that has been cross-sectioned, FIG. 1B is a cross-sectional view of an example light emitting diode structure 100 including example micro light emitting diodes 101, 102, 103, and FIG. 1C is a plan view of the example light emitting diode structure of FIG. 1B, arranged in accordance with at least some implementations of the present disclosure. FIG. 1C provides a cross-sectional view taken along plane A as shown in the plan view of FIG. 1B. FIG. 1B provides a cross-sectional view of micro light emitting diode 101 taken along the x-z plane viewed in the y-direction as shown in FIG. 1A along with cross-sectional views of micro light emitting diodes 102, 103 taken along the same plane. FIG. 1A provides a 3-dimensional view of example micro light emitting diode 101 after cross sectioning and removal of a portion thereof. As illustrated in FIGS. 1B and 1C, micro light emitting diode 101 may have a tube shape that extends around opening 151 or the tube shape may close in on itself such that opening 151 is not present. Although illustrated with a circular tube shape for the sake of clarity, any tube shape may be used such as an oval shape.

In some examples, light emitting diode structure 100 may be characterized as a micro light emitting diode device or the like. As shown, micro light emitting diode 101 may include an electron transport layer core 111, an emission layer 112, a hole transport layer 113, and a reflective cladding 114. Micro light emitting diode 102 may include an electron transport layer core 121, an emission layer 122, a hole transport layer 123, and a reflective cladding 124. Similarly, micro light emitting diode 103 may include an electron transport layer core 131, an emission layer 132, a hole transport layer 133, and a reflective cladding 134. Also as shown, micro light emitting diodes 101, 102, 103 may be disposed on or over a carrier or substrate 104, a buffer layer 105, and a dielectric layer 106.

Light emitting diode structure 100 may include any number of micro light emitting diodes such as micro light emitting diodes 101, 102, 103. In an embodiment, micro light emitting diodes 101, 102, 103 may each be fabricated or configured to emit the same band of light (e.g., a red, green, or blue band). In an embodiment, each of micro light emitting diodes 101, 102, 103 may be fabricated or configured to emit the different bands of light. For example, in operation, micro light emitting diode 101 may emit a red band, micro light emitting diode 102 may emit a green band, and micro light emitting diode 103 may emit a blue band. Such RGB micro light emitting diodes may be arrayed to provide a display device.

Electron transport layer cores 111, 121, 131 may include any suitable material or materials. In an embodiment, electron transport layer cores 111, 121, 131 include n-doped gallium nitride (N-GaN). In an embodiment, the n-type dopant is silicon. Electron transport layer cores 111, 121, 131 may be characterized as a core, an electron transport layer, or the like. Emission layers 112, 122, 132 may also include any suitable material or materials. In an embodiment, emission layers 112, 122, 132 include one or more layers of indium gallium nitride (InGaN) and one or more layers of gallium nitride (GaN). In an embodiment, emission layers 112, 122, 132 include any number of alternating layers of indium gallium nitride (InGaN) and gallium nitride (GaN). Emission layers 112, 122, 132 may be characterized as multiple quantum wells (MQW), active layers, active emission layers, or the like. As discussed below, the indium concentration in the indium gallium nitride layer(s) of emission layers 112, 122, 132 may be tuned to define the band of light emitted. Hole transport layers 113, 123, 133 may similarly include any suitable material or materials. In an embodiment, hole transport layers 113, 123, 133 include p-doped gallium nitride (P-GaN). In an embodiment, the p-type dopant is magnesium. Hole transport layers 113, 123, 133 may be characterized as a hole layer, a p-cladding, or the like. In another embodiment the hole transport layer may be p-type ZnO.

In an embodiment, the different bands of light may be effectuated by adjusting an indium concentration in the indium gallium nitride layer(s) in each of emission layer 112, emission layer 122, and emission layer 132. In an embodiment, an indium concentration of about 41% (e.g., about 40%) in the indium gallium nitride layer(s) may provide a red color micro LED, an indium concentration of about 31% (e.g., about 30%) in the indium gallium nitride layer(s) may provide a green color micro LED, and an indium concentration of about 21% (e.g., about 20%) in the indium gallium nitride layer(s) may provide a blue color micro LED. For example, any device discussed herein may emit a band of light having a peak at a particular wavelength such that a red band of light may include a wavelength of 630 nm, a green band of light may include a wavelength of 540 nm, and a blue band of light may include a wavelength of 470 nm. It is noted that the peak wavelength is not necessarily the wavelengths listed. As shown, micro light emitting diodes 101, 102, 103 may have differing electron transport layer core inner diameters of w1, w2, and w3 respectively. As used herein, an inner diameter is a diameter between inner walls and through a center point of a particular layer. In an embodiment, the indium concentration of the particular emission layer 112, 122, 132 is varied during formation based on the inner wall diameter of the corresponding electron transport layer cores 111, 121, 131. For example, during formation, varying the inner diameter of electron transport layer cores 111, 121, 131 causes, during growth of indium gallium nitride layer(s) of emission layers 112, 122, 132 differing concentrations of indium that can be used to tune the particular micro light emitting diode 101, 102, 103 to a particular emission band. For example, the varying the inner diameter of electron transport layer cores 111, 121, 131 effectuates differing indium mobility during indium gallium nitride layer growth to provide the differing concentrations of indium in the indium gallium nitride layer(s).

In an embodiment, for a red micro light emitting diode 101, electron transport layer core inner diameter w1 is in the range of 200 to 250 nm; for a green micro light emitting diode 102, electron transport layer core inner diameter w2 is in the range of 140 to 160 nm; and for a blue micro light emitting diode 103, electron transport layer core inner diameter w3 is in the range of 80 to 100 nm. In an embodiment, for a red micro light emitting diode 101, electron transport layer core inner diameter w1 is in the range of 205 to 215 nm; for a green micro light emitting diode 102, electron transport layer core inner diameter w2 is in the range of 145 to 155 nm; and for a blue micro light emitting diode 103, electron transport layer core inner diameter w3 is in the range of 85 to 95 nm. In an embodiment, electron transport layer core inner diameter w1 and electron transport layer core inner diameter w2 differ by not less than 20% and/or electron transport layer core inner diameter w2 and electron transport layer core inner diameter w3 differ by not less than 20%. Furthermore, widths of electron transport layer cores 111, 121, 131 (as illustrated with respect to widths w4, w5, w6) may be the same or they may be different. In an embodiment, widths of electron transport layer cores 111, 121, 131 are approximately the same and are all in the range of 50 to 80 nm. In an embodiment, for a red micro light emitting diode 101, electron transport layer core width w4 is in the range of 70 to 80 nm; for a green micro light emitting diode 102, electron transport layer core width w5 is in the range of 60 to 70 nm; and for a blue micro light emitting diode 103, electron transport layer core width w6 is in the range of 50 to 60 nm.

Micro light emitting diodes 101, 102, 103 may be characterized as tube LEDs, microtube LEDs, ring LEDs, annular LEDs, or the like. Micro light emitting diodes 101, 102, 103 provide high power efficacy and a small footprint. In some embodiments, micro light emitting diodes 101, 102, 103 provide a small size (e.g., less than 3 μm) with red, green, and blue (RGB) power efficacies of greater than 20 lm/W, greater than 100 lm/W, and greater than 10 lm/W, respectively.

In operation, coupling may be made to micro light emitting diodes 101, 102, 103 via reflective claddings 114, 124, 134 (e.g., by each of claddings 114, 124, 134 being electrically coupled to an electrode of a driver circuit), which, as shown, may be electrically isolated from one another, and a common electrode (e.g., after removal of substrate 104 and buffer layer 105 and the fabrication of the electrode). Such couplings are discussed further herein. Micro light emitting diodes 101, 102, 103 may then each be activated to generate a band of light. In the context of FIG. 1B, light may emit from the bottom (e.g., after removal of substrate 104 and buffer layer 105) of micro light emitting diodes 101, 102, 103. In other embodiments, in micro light emitting diodes 101, 102, 103, reflective claddings 114, 124, 134 may be replaced by transparent or translucent metal layers and micro light emitting diodes 101, 102, 103 may be pick and placed onto a back plane or the like. In such embodiments, micro light emitting diodes 101, 102, 103 may each be activated to generate a band of light such that, in the context of FIG. 1B, light may emit from the top (e.g., through a transparent metal layer in the place of reflective claddings 114, 124, 134) of micro light emitting diodes 101, 102, 103. In either arrangement, micro light emitting diodes 101, 102, 103 provide for efficient generation and emission of light as well as highly collimated light.

As discussed, micro light emitting diodes 101, 102, 103 may be disposed on or over substrate 104, buffer layer 105, and dielectric layer 106. Substrate 104 may be any suitable material or materials such as silicon (Si), silicon carbide (SiC), sapphire, or the like. For example, substrate 104 may be a carrier wafer. Buffer layer 105 may also be any suitable material or materials. For example, buffer layer 105 may provide a transition from substrate 104 for the fabrication of electron transport layer cores 111, 121, 131. For example, buffer layer 105 may include a stack of layers including one or more of aluminum nitride, gallium nitride, aluminum gallium nitride, titanium nitride, hafnium nitride or the like. In some examples, buffer layer 105 may be characterized as a nucleation layer. Dielectric layer 106 may include any suitable material or materials that provides electrical isolation between micro light emitting diodes 101, 102, 103 and between electron transport layer cores 111, 121, 131 and hole transport layers 113, 123, 133 of micro light emitting diodes 101, 102, 103. For example, dielectric layer 106 may include silicon nitride or the like. Dielectric layer 106 may be characterized as a mask layer or the like. In the context of FIG. 1B, dielectric layer 106 may include a single material. In other examples, dielectric layer 106 may include multiple regions of differing materials as is discussed further herein. As used herein, the term substrate may indicate any layer or layers adjacent to micro light emitting diodes 101, 102, 103. For example, one or more of substrate 104, buffer layer 105, and dielectric layer 106 may provide a substrate for micro light emitting diodes 101, 102, 103. Furthermore a substrate may be monolithic in that it includes a continuous layer or layers, material or materials, structure, group of structures, or the like. As shown, dielectric layer 106 may include a portion 161 extending between electron transport layer cores 111, 121 and a portion 162 extending between electron transport layer cores 121, 131. Dielectric layer also includes a portions between electron transport layer cores 111, 121, 131 and hole transport layers 113, 123, 133, respectively, as illustrated with respect to portion 163 to provide electrical isolation therebetween.

As discussed, micro light emitting diodes 101, 102, 103 may include electron transport layer cores 111, 121, 131, respectively. As shown with respect to electron transport layer core 111, electron transport layer cores 111, 121, 131 may include inner sidewalls 141 and outer sidewalls 142 such that inner sidewall 141 is inward facing (e.g., toward opening 151 or a center 152 of micro light emitting diode 101) and outer sidewall 142 is outward facing (e.g., away from opening 151 or center 152). Also as shown, sidewalls 141, 142, may extend from a proximal end 145 adjacent to buffer layer 105 and substrate 104 to a distal end 146 extending away from buffer layer 105 and substrate 104. As in the illustrated embodiment, sidewalls 141, 142 may be substantially vertical. In other embodiments, sidewalls 141, 142 may be sloped. As will be appreciated, electron transport layer cores 121, 131 include similar sidewalls and characteristics.

Furthermore, emission layer 112, 122, 132, hole transport layers 113, 123, 133, and reflective claddings 114, 124, 134 have inner sidewalls, outer sidewalls, and distal ends in analogy with those discussed with respect to inner sidewall 141, outer sidewall 142, and distal end 146. As shown, emission layer 112, 122, 132, hole transport layers 113, 123, 133, and reflective claddings 114, 124, 134 substantially conform to electron transport layer cores 111, 121, 131. As shown with respect to electron transport layer core 131, electron transport layer cores 111, 121, 131 may have a height (h) of about 1 to 3 microns. However, electron transport layer cores 111, 121, 131 may have any suitable dimensions.

As shown, emission layers 112, 122, 132 may be disposed on sidewalls and ends of electron transport layer cores 111, 121, 131 as illustrate with respect to sidewalls 141, 142 and end 146 of electron transport layer core 111. For example, emission layers 112, 122, 132 may wrap around distal ends and portions of the sidewalls of electron transport layer cores 111, 121, 131. Similarly, hole transport layers 113, 123, 133 are on emission layers 112, 122, 132 such that transport layers 113, 123, 133 are on sidewalls and ends of emission layers 112, 122, 132. For example, hole transport layers 113, 123, 133 may wrap around emission layers 112, 122, 132. The discussed shape of electron transport layer cores 111, 121, 131 (e.g., a tube, ring, or annular shape) may provide for substantial contact area among electron transport layer cores 111, 121, 131, emission layers 112, 122, 132, and hole transport layers 113, 123, 133 for improved efficiency. Furthermore, electron transport layer cores 111, 121, 131 extending substantially along a vertical axis or perpendicular to buffer layer 105 and substrate 104 may provide for an efficient emission route for light generated by micro light emitting diodes 101, 102, 103. Also as shown, micro light emitting diodes 101, 102, 103 may include reflective claddings 114, 124, 134, which may include any suitable material or materials such as one or more metals or the like. For example, reflective claddings 114, 124, 134 may provide reflection of light generated by micro light emitting diodes 101, 102, 103 and electrical contact (e.g., an electrode) to hole transport layers 113, 123, 133 of micro light emitting diodes 101, 102, 103. As shown, in an embodiment, reflective claddings 114, 124, 134 are on hole transport layers 113, 123, 133 such that reflective claddings 114, 124, 134 are on sidewalls and ends of hole transport layers 113, 123, 133.

Figure 2:
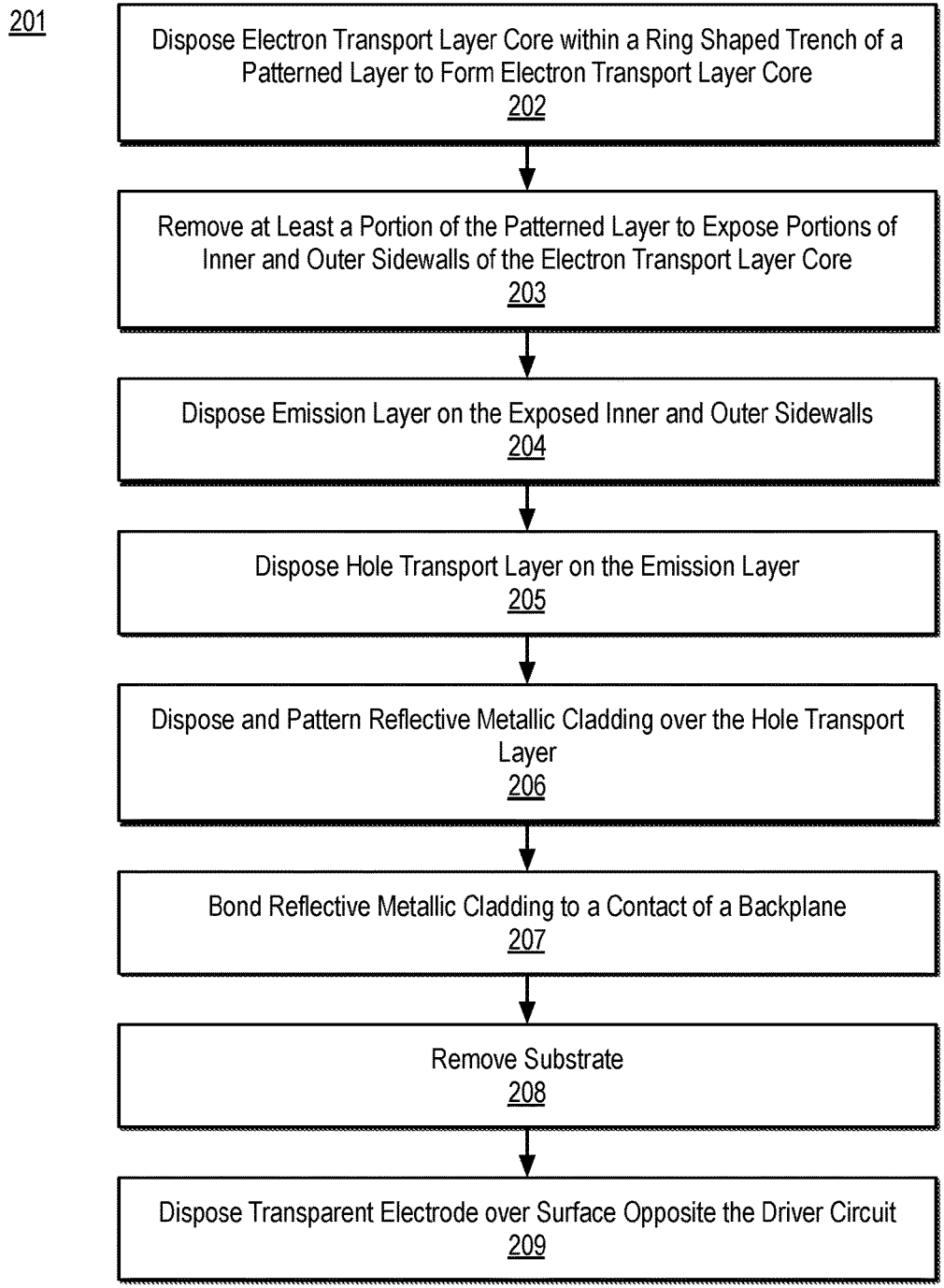
FIG. 2 is a flow diagram illustrating an example process for fabricating a light emitting diode device.

FIG. 2 is a flow diagram illustrating an example process 201 for fabricating a light emitting diode device, arranged in accordance with at least some implementations of the present disclosure. For example, process 201 may be implemented to fabricate any suitable light emitting diode structure discussed herein such as light emitting diode structure 100. In the illustrated implementation, process 201 may include one or more operations as illustrated by operations 202-209. However, embodiments herein may include additional operations, certain operations being omitted, or operations being performed out of the order provided.

Process 201 may begin at operation 202, where an electron transport layer core may be disposed within a trench of a patterned layer over a substrate. The patterned layer may include any suitable material or materials such as silicon nitride and may be patterned using any suitable technique or techniques such as photolithography and etch techniques. The electron transport layer core may be disposed within the trench using any suitable technique or techniques such as metal-organic chemical vapor deposition, metal-organic vapor phase epitaxy, or the like. In an embodiment, the electron transport layer core may be disposed within the trench using deposition with hydrazine providing the nitrogen for n-doped gallium nitride growth at a temperature of not more than 700° C. Furthermore, the substrate may include any suitable materials or layers such as a buffer layer of AlN/GaN or the like. The electron transport layer core may have any characteristics as discussed with respect to electron transport layer cores 111, 121, 131. In an embodiment, one or more of electron transport layer cores 111, 121, 131 may be disposed within trenches of a patterned layer as discussed herein with respect to FIGS. 3A and 3B.

Process 201 may continue at operation 203, where at least a portion of the patterned layer may be removed to portions of inner and outer sidewalls of the electron transport layer core. The portion of the patterned layer may be removed using any suitable technique or techniques such as wet etch techniques or the like. In an embodiment, portions of the patterned layer may be removed to expose one or more of electron transport layer cores 111, 121, 131 as discussed herein with respect to FIG. 3C.

Process 201 may continue at operation 204, where an emission layer may be disposed on the top and exposed inner and outer sidewalls of the electron transport layer core. In an embodiment, the emission layer may be disposed conformably on the electron transport layer core. The emission layer may be disposed on the top and sidewalls of the electron transport layer core using any suitable technique or techniques such as selective epitaxy or the like. In an embodiment, the emission layer may be disposed on the top and exposed inner and outer sidewalls of the electron transport layer core with hydrazine providing the nitrogen for alternating gallium nitride growth and indium gallium growth at a temperature of not more than 700° C. In an embodiment, emission layers 112, 122, 132 may be disposed on the top and exposed portions of sidewalls of electron transport layer cores 111, 121, 131 as discussed herein with respect to FIG. 3D.

Process 201 may continue at operation 205, where a hole transport layer may be disposed on the emission layers. The hole transport layer may be disposed on the emission layers using any suitable technique or techniques such as selective epitaxy or the like. In an embodiment, the hole transport layer may be disposed conformably on the emission layers. In an embodiment, the hole transport layer may be disposed on the emission layers with hydrazine providing the nitrogen for p-doped gallium nitride growth at a temperature of not more than 700° C. In an embodiment, hole transport layers 113, 123, 133 may be disposed on emission layers 112, 122, 132 as discussed herein with respect to FIG. 3E.

Process 201 may continue at operation 206, where reflective cladding such as a reflective metal cladding may be disposed over the hole transport layer and patterned. The reflective cladding may be disposed and patterned using any suitable technique or techniques. For example, the reflective cladding may be disposed using electroplating or physical vapor deposition techniques and patterned by applying a planar surface, patterning the planar surface, and etching cladding exposed by the patterned planar surface. In an embodiment, reflective claddings 114, 124, 134 may be disposed on hole transport layers 113, 123, 133 and patterned as discussed herein with respect to FIGS. 3F-3H.

Process 201 may continue at operation 207, where the reflective cladding may be bonded to a contact or conductive electrode or the like of a driver circuit or display backplane. The reflective cladding may be bonded to the conductive electrode using any suitable technique or techniques. In an embodiment, the micro light emitting diode may be picked and placed on the conductive electrode (e.g., such that the reflective cladding is disposed on the conductive electrode) using direct transfer or stamp transfer operations. In an embodiment, the carrier including the micro light emitting diode may be flip bonded to a substrate including the conductive electrode. Although discussed with respect to bonding techniques, in other examples, the driver circuit may be formed by monolithic integration of a thin film transistor (e.g., polysilicon, amorphous silicon, organic TFTs, etc.) or the like. In an embodiment, reflective claddings 114, 124, 134 may be disposed on contacts or conductive electrodes of a driver circuit as discussed herein with respect to FIG. 3I.

Process 201 may continue at operation 208, where the substrate and buffer layer may be removed. The substrate may be removed using any suitable technique or techniques such as techniques, wet etch techniques, UV or infrared laser release techniques. The exposed buffer layer may then be removed using any suitable technique or techniques such as wet or dry etch techniques. In an embodiment, substrate 104 and buffer layer 105 may be removed as discussed herein with respect to FIG. 3J.

Process 201 may continue at operation 209, where a transparent electrode may be disposed over a surface of the micro light emitting diode or of an emission surface opposite the driver circuit. The transparent electrode may be disposed using any suitable technique or techniques. For example, the transparent electrode may be deposited using physical vapor deposition and patterned, if needed, using lithography and etch techniques. In an embodiment, the transparent electrode may be disposed on dielectric layer 106 and electron transport layer cores 111, 121, 131 subsequent to the removal of substrate 104 and buffer layer 105 as discussed herein with respect to FIG. 3K.

Process 201 may be utilized to generate any light emitting diode structure as discussed herein such as those discussed with respect to light emitting diode structure 100. In an embodiment, process 201 may generate an example structure of micro light emitting diodes as shown with respect to FIG. 3K. In some embodiments, process 201 may generate multiple micro light emitting diodes configured to emit a same band of light (e.g., red, green, or blue LEDs). In some embodiments, process 201 may generate multiple micro light emitting diodes configured to emit different bands of light (e.g., red, green, or blue LEDs).

Figure 3A:
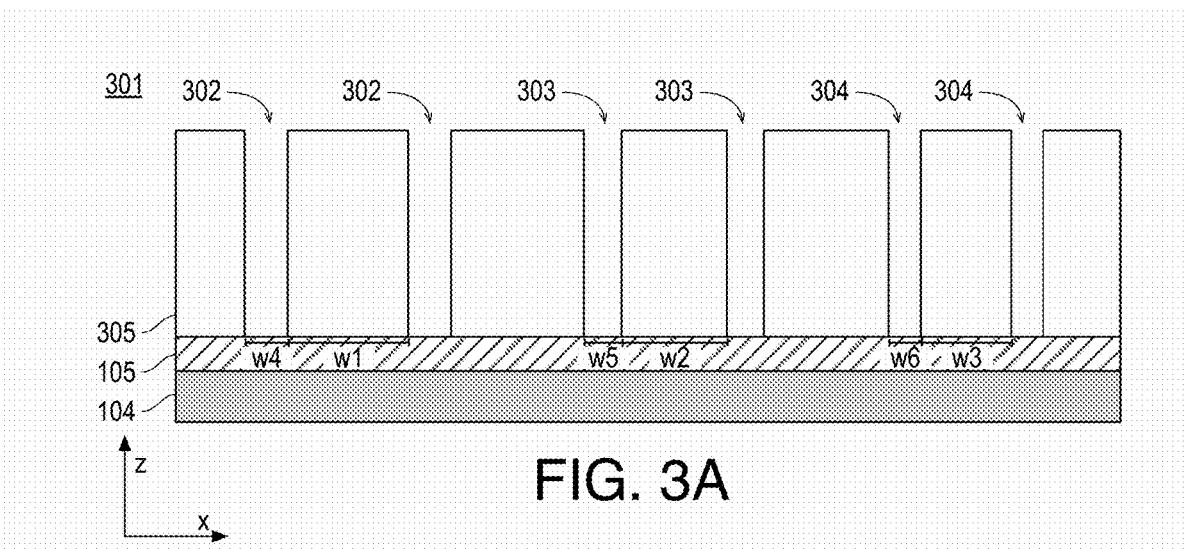
FIGS. 3A, 3B, 3C, 3D, 3E, 3F, 3G, 3H, 3I, 3J, and 3K are cross-sectional views of example light emitting diode structures as particular fabrication operations are performed.

FIGS. 3A, 3B, 3C, 3D, 3E, 3F, 3G, 3H, 3I, 3J, and 3K are cross-sectional views of example light emitting diode structures as particular fabrication operations are performed, arranged in accordance with at least some implementations of the present disclosure. FIG. 3A illustrates a cross-sectional view of a light emitting diode structure 301 taken along the same plan as shown in FIG. 1B. As shown in FIG. 3A, light emitting diode structure 301 includes substrate 104, buffer layer 105, and a patterned layer 305 having openings 302, 303, 304. For example, substrate 104 may be any carrier or substrate as discussed herein such as a silicon substrate or wafer, a silicon carbide substrate or wafer, a sapphire substrate or wafer, or the like. Buffer layer 105 may be formed on substrate 104 using any suitable technique or techniques. For example, buffer layer 105 may be deposited and/or grown on substrate 104. Furthermore, buffer layer 105 may include any suitable materials as discussed herein such as a stack of layers including one or more of aluminum nitride, silicon nitride, gallium nitride, or the like. In some embodiments, substrate 104 may include a buffer layer or a buffer layer may not be employed.

Patterned layer 305 may include any suitable material or materials such as insulator materials. In an embodiment, patterned layer 305 is silicon nitride. Patterned layer 305 may be characterized as a mold, pattern, or the like. Patterned layer 305 may be patterned to form openings 302, 303, 304 using any suitable technique or techniques such as lithography and etch techniques. Patterned layer 305 may have any thickness such as a thickness in the range of about 500 nanometers to 3 microns. For example, the thickness of patterned layer 305 may be selected to provide a desired height of electron transport layer cores 111, 121, 131. Openings 302, 303, 304 may have any suitable dimensions (e.g., inner diameters w1-w3 and widths w4-w6) as discussed herein. For example, the dimensions of openings 302, 303, 304 may be selected to provide desired spatial characteristics of electron transport layer cores 111, 121, 131. Openings 302, 303, 304 are (from a top down view) annular openings. In some examples, openings 302, 303, 304 may be characterized as trenches and/or patterned layer 305 may be characterized as a mask layer.

Figure 3B:
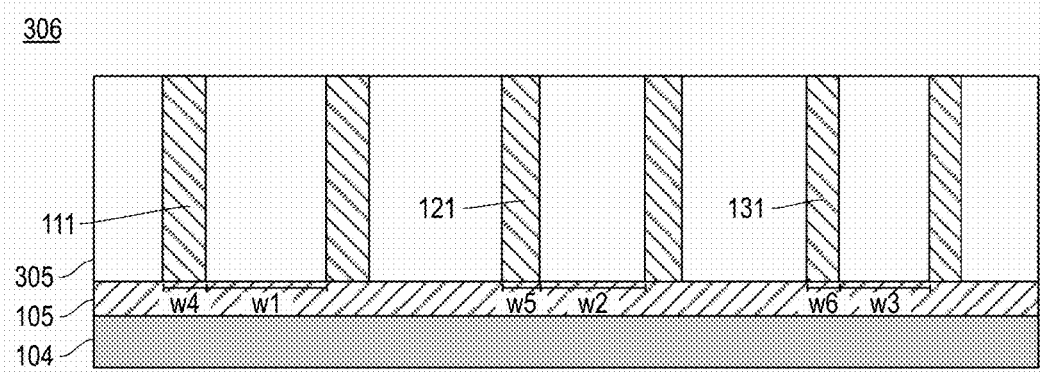

FIG. 3B illustrates a light emitting diode structure 306 similar to light emitting diode structure 301, after the formation of electron transport layer cores 111, 121, 131. Electron transport layer cores 111, 121, 131 may be formed using any suitable technique or techniques such as metalorganic chemical vapor deposition, metal-organic vapor phase epitaxy, or the like. In some embodiments, electron transport layer cores 111, 121, 131 may be n-doped gallium nitride as discussed herein. In an embodiment, transport layer cores 111, 121, 131 may be n-doped gallium nitride grown at a low temperature (e.g., not greater than 700° C.) by supplying nitrogen via hydrazine ($N_2H_2$). In an embodiment, a chemical mechanical polish operation may be performed after the formation of electron transport layer cores 111, 121, 131.

Figure 3C:
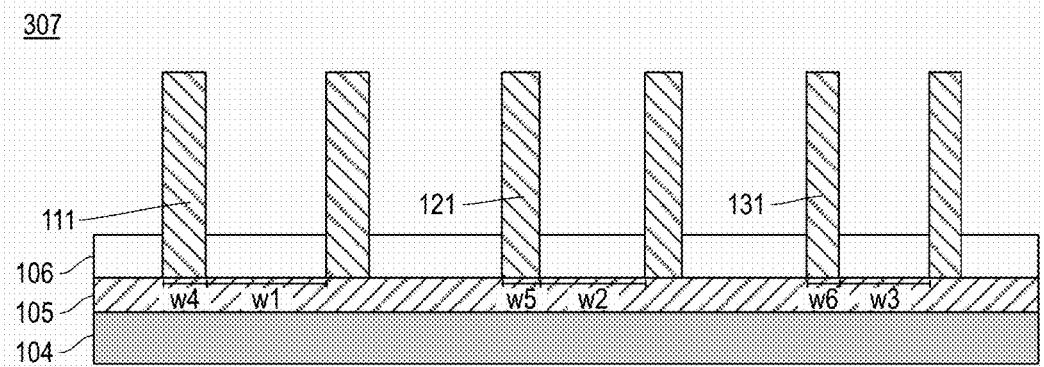

FIG. 3C illustrates a light emitting diode structure 307 similar to light emitting diode structure 306, after the removal of portions of patterned layer 305 to expose portions of electron transport layer cores 111, 121, 131 and provide dielectric layer 106 as discussed herein. The removed portions of patterned layer 305 may be removed using any suitable technique or techniques such as selective wet etch techniques or the like. In an embodiment, the wet etch may be timed wet etch to leave a desired thickness of dielectric layer 106 (e.g., 100-500 nm).

Figure 3D:
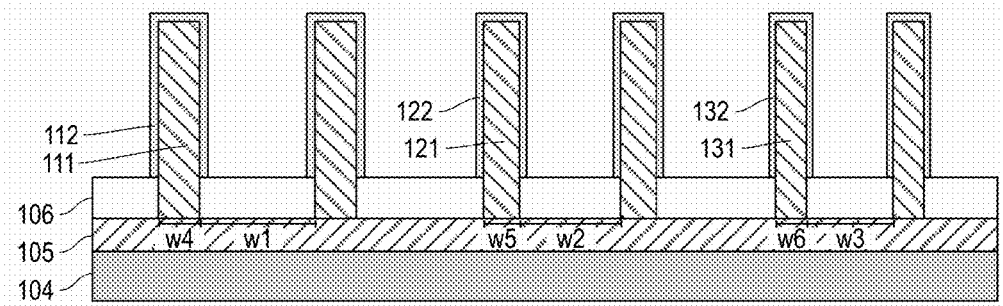

FIG. 3D illustrates a light emitting diode structure 308 similar to light emitting diode structure 307, after the selective growth of emission layers 112, 122, 132. Emission layers 112, 122, 132 may be formed using any suitable technique or techniques. In an embodiment, emission layers 112, 122, 132 are formed using selective epitaxy operations such that emission layers 112, 122, 132 are grown selective to only electron transport layer cores 111, 121, 131. Emission layers 112, 122, 132 may include any suitable material or materials such as one or more layers of indium gallium nitride and one or more layers of gallium nitride. For example, emission layers 112, 122, 132 may include alternating layers of indium gallium nitride and gallium nitride such that the concentration of indium in the indium gallium nitride layer(s) determines the light band of the resultant micro LED. As discussed, an indium concentration of about 41% may provide a red band, an indium concentration of about 31% may provide a green band, and an indium concentration of about 20% may provide a blue band. In an embodiment, emission layers 112, 122, 132 include alternating layers of indium gallium nitride and gallium nitride grown at a low temperature (e.g., not greater than 700° C.) by supplying nitrogen via hydrazine ($N_2H_2$).

In an embodiment, emission layer 112 includes indium concentration of about 41%, emission layer 122 includes indium concentration of about 31%, and emission layer 132 includes indium concentration of about 20%. For example, such concentrations may be formed in the same operation by selecting the dimensions of widths w1-w6 as discussed herein. In an embodiment, the indium concentration of the particular emission layer 112, 122, 132 is varied during formation based on the inner wall diameters w1, w2, w3 of the corresponding electron transport layer cores 111, 121, 131 as discussed herein. For example, varying the inner diameter of electron transport layer cores 111, 121, 131 causes, during growth of indium gallium nitride layer(s) of emission layers 112, 122, 132 differing concentrations of indium through differing indium mobility during indium gallium nitride layer growth. As discussed, in an embodiment, for emission layer 112 to have an indium concentration of about 41%, inner diameter w1 of electron transport layer core 111 is in the range of 200 to 220 nm (with 205 to 215 nm being particularly advantageous); for emission layer 122 to have an indium concentration of about 31%, inner diameter w2 of electron transport layer core 111 is in the range of 140 to 160 nm (with 145 to 155 nm being particularly advantageous); and for emission layer 112 to have an indium concentration of about 20%, inner diameter w3 of electron transport layer core 131 is in the range of 80 to 100 nm (with 85 to 95 nm being particularly advantageous). Furthermore, widths of electron transport layer cores 111, 121, 131 (as illustrated with respect to widths w4, w5, w6) may be the same or they may be different. In an embodiment, widths of electron transport layer cores 111, 121, 131 are approximately the same and are all in the range of 50 to 80 nm. In an embodiment, for a red micro light emitting diode 101, electron transport layer core width w4 is in the range of 70 to 80 nm; for a green micro light emitting diode 102, electron transport layer core width w5 is in the range of 60 to 70 nm; and for a blue micro light emitting diode 103, electron transport layer core width w6 is in the range of 50 to 60 nm. Electron transport layer cores 111, 121, 131 may have any suitable thickness such as 10-100 nm.

Figure 3E:
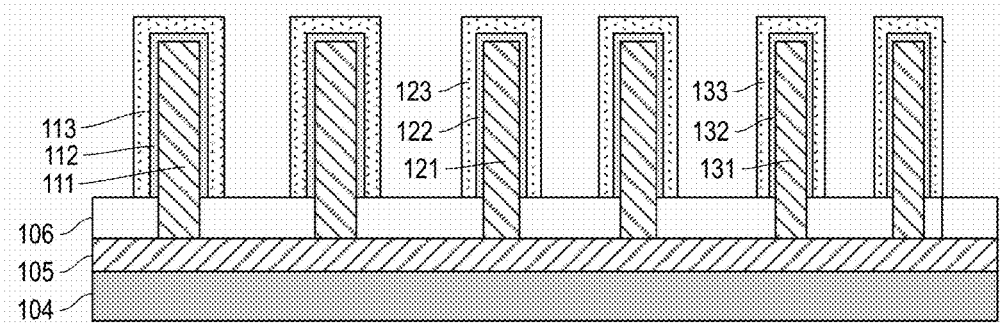

FIG. 3E illustrates a light emitting diode structure 309 similar to light emitting diode structure 308, after the selective growth of hole transport layers 113, 123, 133. Hole transport layers 113, 123, 133 may be formed using any suitable technique or techniques such as selective epitaxy techniques such that hole transport layers 113, 123, 133 are grown selective to only emission layers 112, 122, 132. Hole transport layers 113, 123, 133 may include any suitable material or materials such as p-doped gallium nitride or p-doped ZnO as discussed herein. In an embodiment, hole transport layers 113, 123, 133 may be formed using metalorganic chemical vapor deposition or the like. In an embodiment, hole transport layers 113, 123, 133 may be p-doped gallium nitride grown at a low temperature (e.g., not greater than 700° C.) by supplying nitrogen via hydrazine ($N_2H_2$). As shown, light emitting diode structure 309 may be formed without etching any of electron transport layer cores 111, 121, 131, emission layers 112, 122, 132, or hole transport layers 113, 123, 133. Such fabrication techniques may offer the advantages of reduced damage to the micro light emitting diodes and increased efficiency in operation. Home transport layers 113, 123, 133 may have any suitable thickness such as 20-100 nm.

Figure 3F:
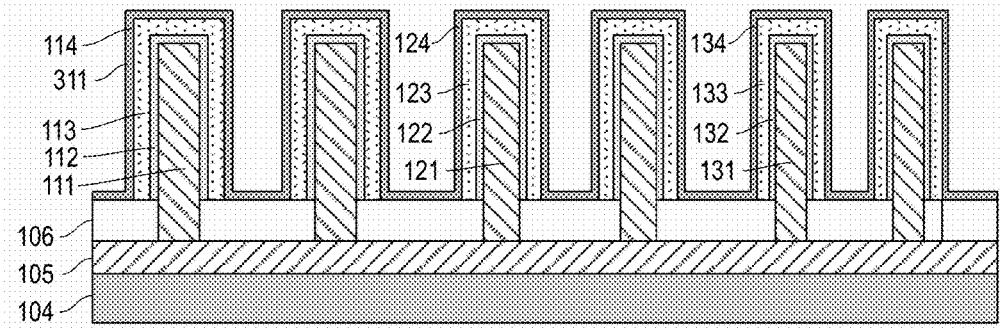

FIG. 3F illustrates a light emitting diode structure 310 similar to light emitting diode structure 309, after the formation of cladding layer 311. Cladding layer 311 may be formed on hole transport layers 113, 123, 133 (e.g., also over electron transport layer cores 111, 121, 131 and emission layers 112, 122, 132), and exposed portions of dielectric layer 106 using any suitable technique or techniques such as electroplating techniques, physical vapor deposition techniques or the like. Cladding layer 311 may include any suitable material or materials such as aluminum, silver, copper, or the like. For example, cladding layer 311 may be a metal layer. As discussed, in operation, cladding layer 311 (i.e., reflective claddings 114, 124, 134) reflect light emitted from emission layers 112, 122, 132 (e.g., multi-quantum wells) of micro light emitting diodes 101, 102, 103 toward buffer layer 105). In some embodiments, the light emitted from micro light emitting diodes 101, 102, 103 is superlambertian. Cladding layer 311 may have any suitable thickness such as 10-100 nm.

Figure 3G:
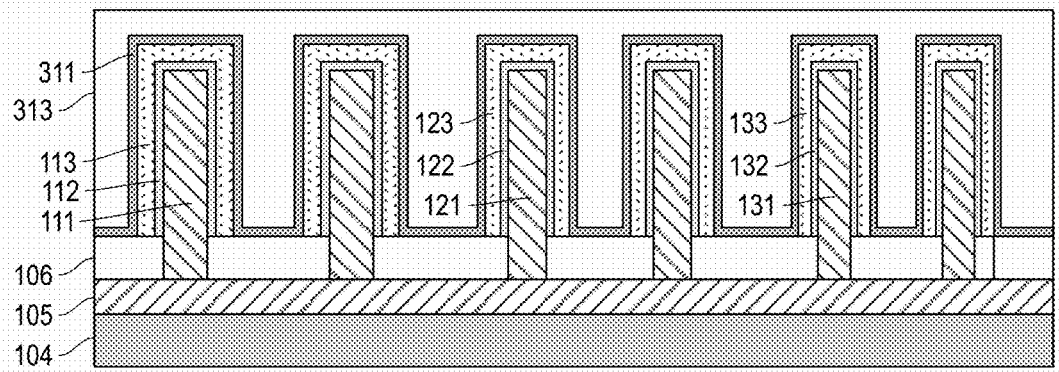

FIG. 3G illustrates a light emitting diode structure 312 similar to light emitting diode structure 310, after the formation of planarization layer 313. Planarization layer 313 may provide a planar surface for subsequent patterning of cladding layer 311. Planarization layer 313 may include any suitable material or materials and planarization layer 313 may be formed using any suitable technique or techniques. For example, planarization layer 313 may be silicon dioxide formed by plasma enhanced chemical vapor deposition and chemical mechanical polishing.

Figure 3H:
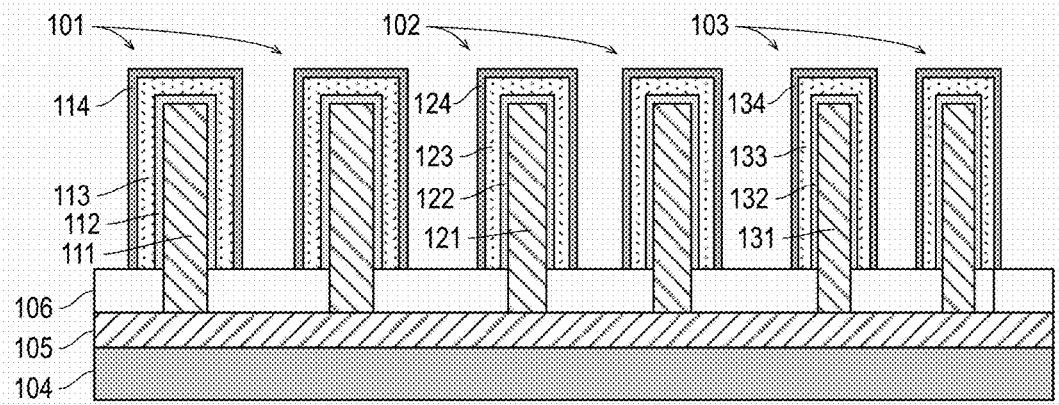

FIG. 3H illustrates a light emitting diode structure 314 similar to light emitting diode structure 312, after the patterning of cladding layer 311 to provide reflective claddings 114, 124, 134 and the removal of planarization layer 313. Cladding layer 311 may be patterned to form reflective claddings 114, 124, 134 using any suitable technique or techniques. For example, planarization layer 313 may be patterned using lithography and etch operations to provide openings in planarization layer 313 and the openings may be used to etch exposed portions of cladding layer 311 to provide reflective claddings 114, 124, 134. As shown, reflective claddings 114, 124, 134 may electrically isolate micro light emitting diodes 101, 102, 103.

Figures 3I, 3J:
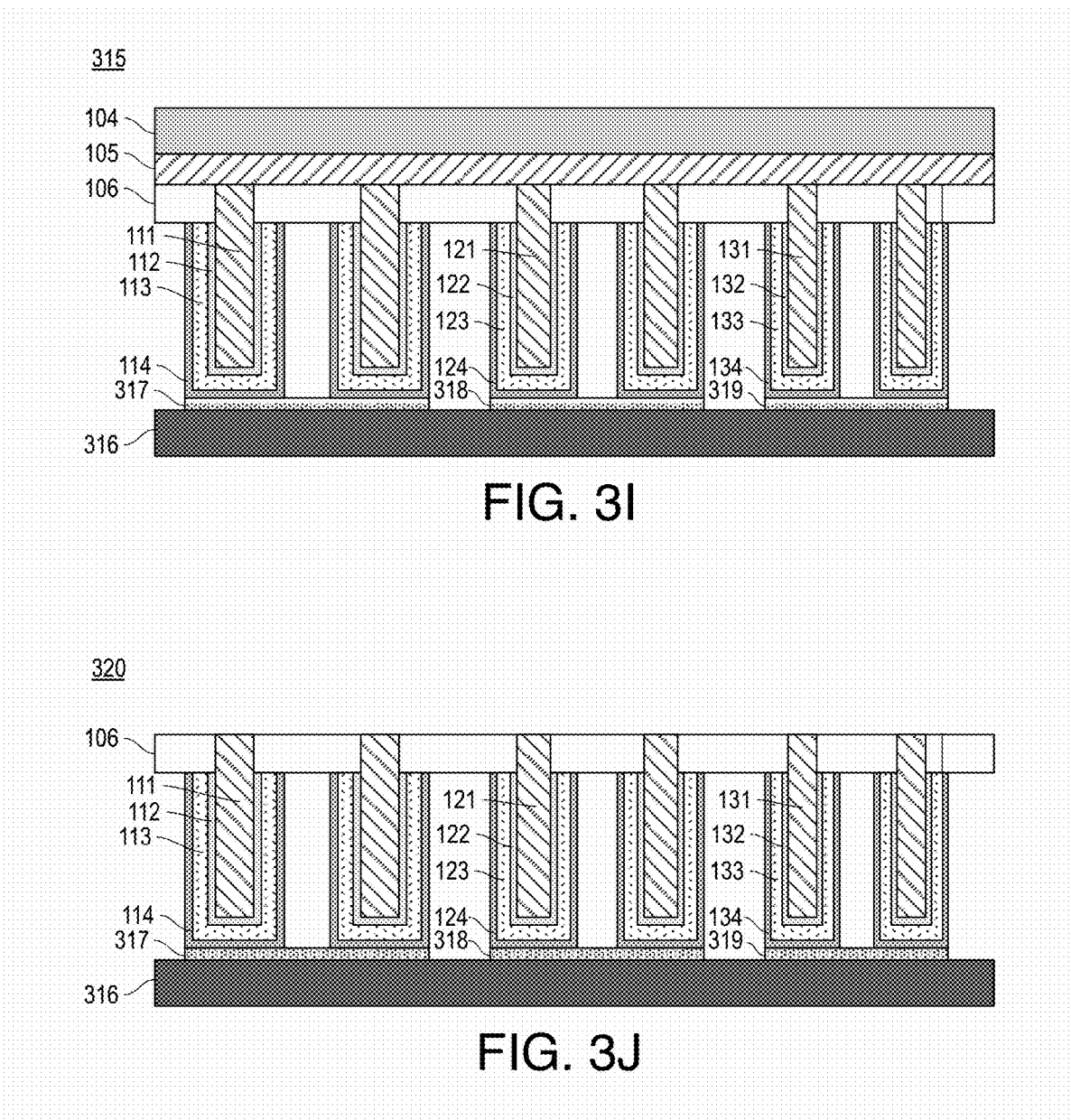

FIG. 3I illustrates a light emitting diode structure 315 similar to light emitting diode structure 314, after the bonding of light emitting diode structure 314 to driver circuit 316. Light emitting diode structure 314 may be bonded to driver circuit 316 using any suitable technique or techniques. For example, as shown, driver circuit 316 may include conductive electrodes 317, 318, 319, which may be bonded to reflective claddings 114, 124, 134, respectively. Driver circuit 316 may include any suitable circuitry and/or structures for driving micro light emitting diodes 101, 102, 103 during operation such as transistors, control circuitry, or the like. For example, driver circuit 316 may be provided as a back plane, a wafer, a thin film transistor device, or the like. In the illustrated example, light emitting diode structure 314 may be bonded to driver circuit 316 using wafer bonding techniques. In other examples, driver circuit 316 may be formed by monolithic integration of a thin film transistor (e.g., polysilicon, amorphous silicon, organic TFTs, etc.). In yet other examples, in micro light emitting diodes 101, 102, 103, reflective claddings 114, 124, 134 may be replaced by transparent or translucent metal layers and micro light emitting diodes 101, 102, 103 may be pick and placed onto driver circuit 316. In such embodiments, micro light emitting diodes 101, 102, 103 may each be activated to generate a band of light such that, in the context of FIG. 1B, light may emit from the top (e.g., through a transparent metal layer in the place of reflective claddings 114, 124, 134) of micro light emitting diodes 101, 102, 103.

FIG. 3J illustrates a light emitting diode structure 320 similar to light emitting diode structure 315, after the removal of substrate 104 and buffer layer 105. Substrate 104 and buffer layer 105 may be removed using any suitable technique or techniques such as polish techniques, wet etch techniques, UV or infrared laser release techniques, etc.

Figure 3K:
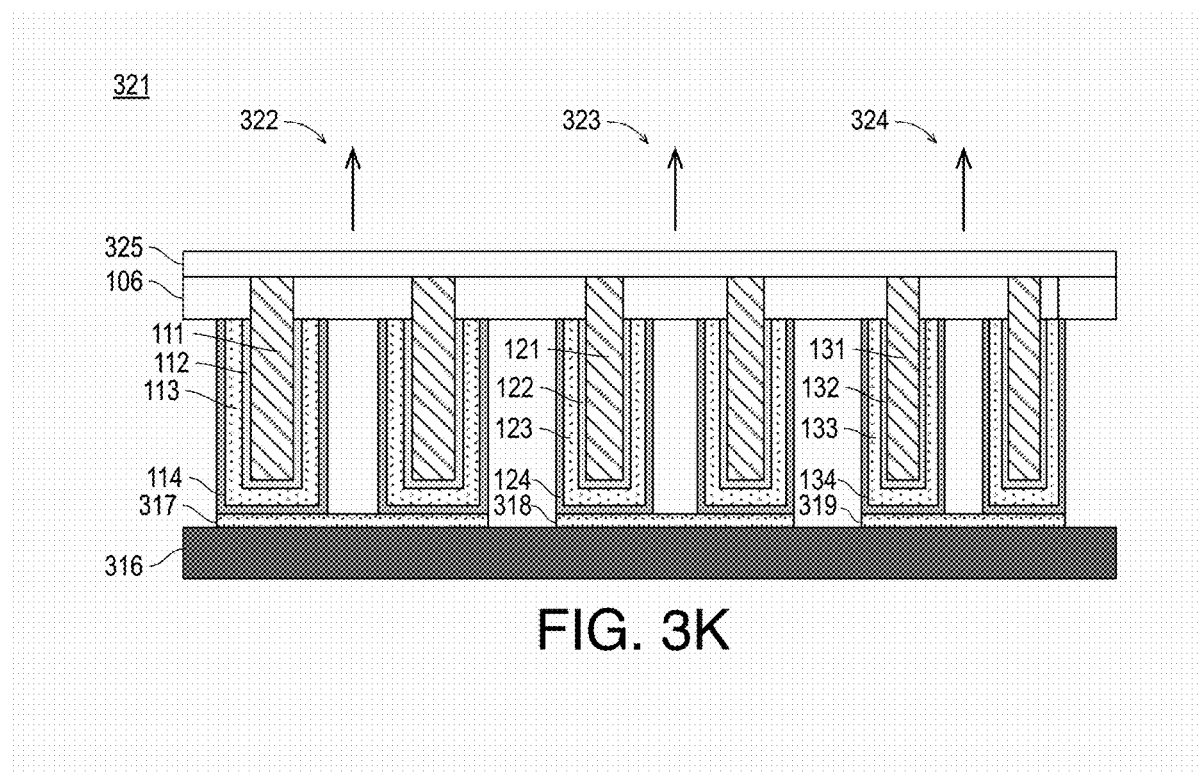

FIG. 3K illustrates a light emitting diode structure 321 similar to light emitting diode structure 320, after formation of common electrode 325. Electrode 325 may be formed using any suitable technique or techniques. In an embodiment, electrode 325 is indium tin oxide (ITO) deposited using physical vapor deposition and patterned, as needed, using lithography and etch techniques. As shown, in an embodiment, electrode 325 is disposed on dielectric layer 106 and transport layer cores 111, 121, 131. As shown, in operation, light emitting diode structure 321 may provide bands of light 322, 323, 324 (e.g., bands of red, green, and blue light) as discussed herein. In an embodiment, a light emitting diode display architecture includes thin film transistors that may be disposed on or within driver circuit 316, LEDs such as micro light emitting diodes 101, 102, 103 disposed over the thin film transistors in an RGB array and a transparent conducive film, common electrode 325, disposed over the LEDs.

As shown, the operations corresponding to FIGS. 3I-3K may provide a bonding technique such that all of micro light emitting diodes 101, 102, 103 are flip bonded to driver circuit 316. In other embodiments, micro light emitting diodes 101, 102, 103 may be transferred from substrate 104 to a separate driver circuit 316 or glass substrate or the like using direct transfer techniques or stamp transfer techniques or the like. For example, each or a group of micro light emitting diodes 101, 102, 103 may be picked using an adhesive or silicone such a polydimethylsiloxane, an electrostatic bonding, an electromagnetic bonding, a vacuum bonding, or the like, and placed on a glass substrate or the like. In some embodiments, as discussed, each of micro light emitting diodes 101, 102, 103 may emit the same band of light in operation (e.g., red light). In such embodiments, separate light emitting diode structures each to emit other bands (e.g., green and blue) may be fabricated and the red, green, and blue micro light emitting diodes from the separate light emitting diode structures may be assembled onto the same glass substrate as an array of micro LEDs or the like to provide an RGB capable display.

Figure 4:
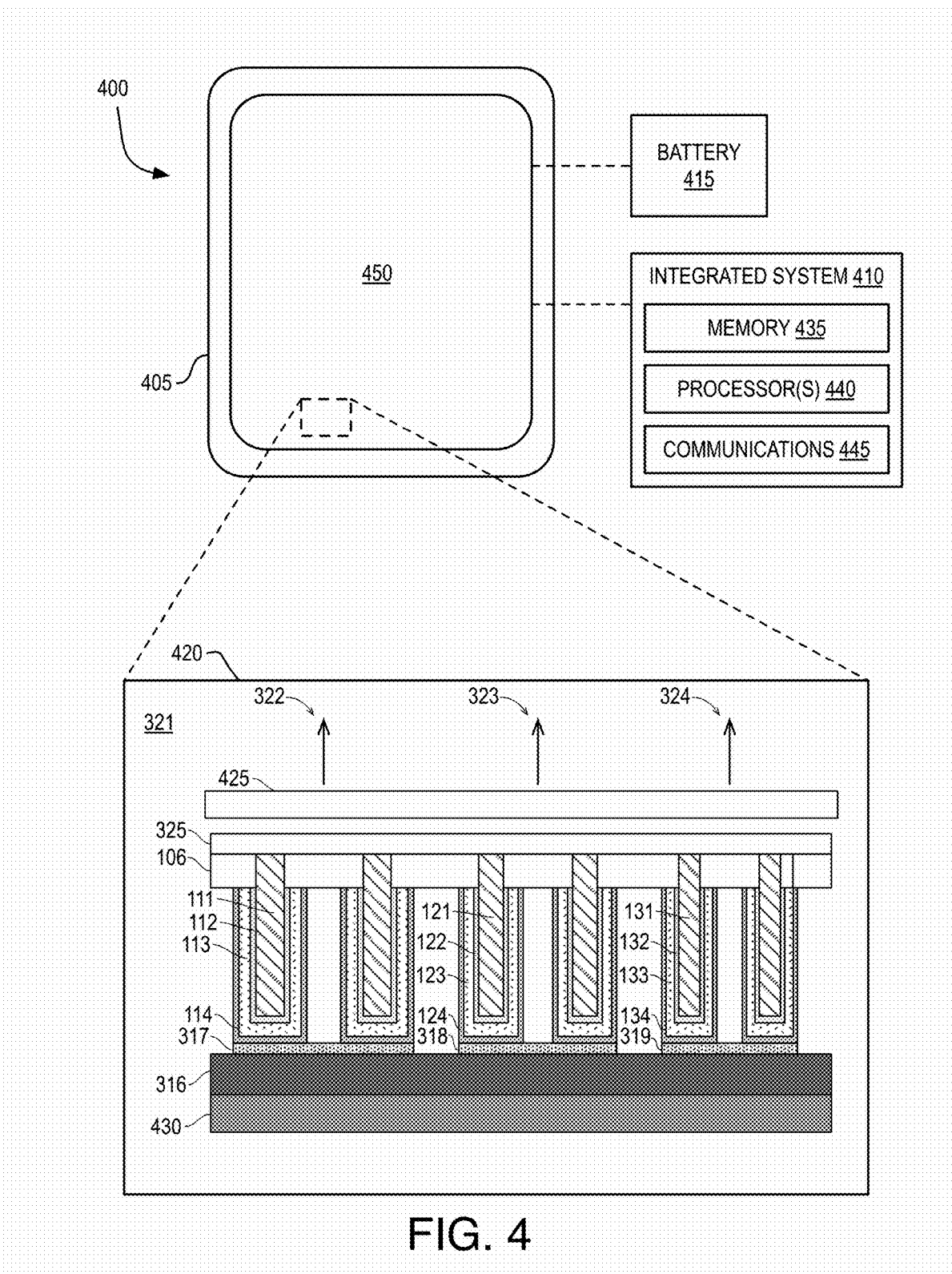
FIG. 4 illustrates a system in which a mobile computing platform employs a light emitting diode structure.

FIG. 4 illustrates a system 400 in which a mobile computing platform 405 employs a light emitting diode structure, arranged in accordance with at least some implementations of the present disclosure. Mobile computing platform 405 may be any portable device configured for each of electronic data display, electronic data processing, wireless electronic data transmission, or the like. For example, although illustrated as a tablet, mobile computing platform 405 may be any of a tablet, a smartphone, a laptop computer, a watch, an augmented reality device, a virtual reality device, a headset, etc., and may include a display device 450 employing a light emitting diode structure such as light emitting diode structure 324 as illustrated in expanded view 420.

Also as illustrated in expanded view 420, display device 450 may include a glass front plate 425 and a back plane or plate 430. For example, glass front plate 425 may be disposed adjacent to electrode 325 and may provide protection for components of light emitting diode structure 321 and a monolithic display structure for a viewer of display device 450. Back plane 430 may similarly provide a monolithic structure for implementing and/or housing light emitting diode structure 321 and/or other components of display device 450. In an embodiment, driver circuit 316 is implemented via backplane 430. Furthermore, glass front plate 425 and/or back plane 430 may provide components of and/or be provided within a housing of system 400.

Although illustrated with respect to light emitting diode structure 321, any suitable light emitting diode structure or any suitable micro light emitting diode or diodes such as micro light emitting diodes 101, 102, 103 may be implemented in display device 450. In some embodiments, micro light emitting diodes 101, 102, 103 may be pick and placed on driver circuit 316 as implemented via backplane 430. Furthermore, display device 450 may provide touch capability via a capacitive, inductive, resistive, or optical touchscreen. Also as shown, mobile computing platform 405 includes a chip-level or package-level integrated system 410 and a battery 415. Although illustrated with respect to mobile computing platform 405, the micro light emitting diodes and light emitting diode structure s discussed herein may also be employed via a display of a desktop computer, television, or the like.

Integrated system 410 may be implemented as discrete components (e.g., integrated circuits) or as a system on a chip and may include may include memory circuitry 435 (e.g., random access memory, storage, etc.), processor circuitry 440 (e.g., a microprocessor, a multi-core microprocessor, graphics processor, etc.), and communications circuitry 445 (e.g., a wireless transceiver, a radio frequency integrated circuit, a wideband RF transmitter and/or receiver, etc.). The components of integrated system 410 may be communicatively coupled to one another for the transfer of data within integrated system 410. Functionally, memory circuitry 435 may provide memory and storage for integrated system 410 including image and/or video data for display by display device 450, processor circuitry 440 may provide high level control for mobile computing platform 405 as well as operations corresponding to generating image and/or video data for display by display device 450, and communications circuitry 445 may transmit and/or receive data including image and/or video data for display by display device 450. For example, communications circuitry 445 may be coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 5:
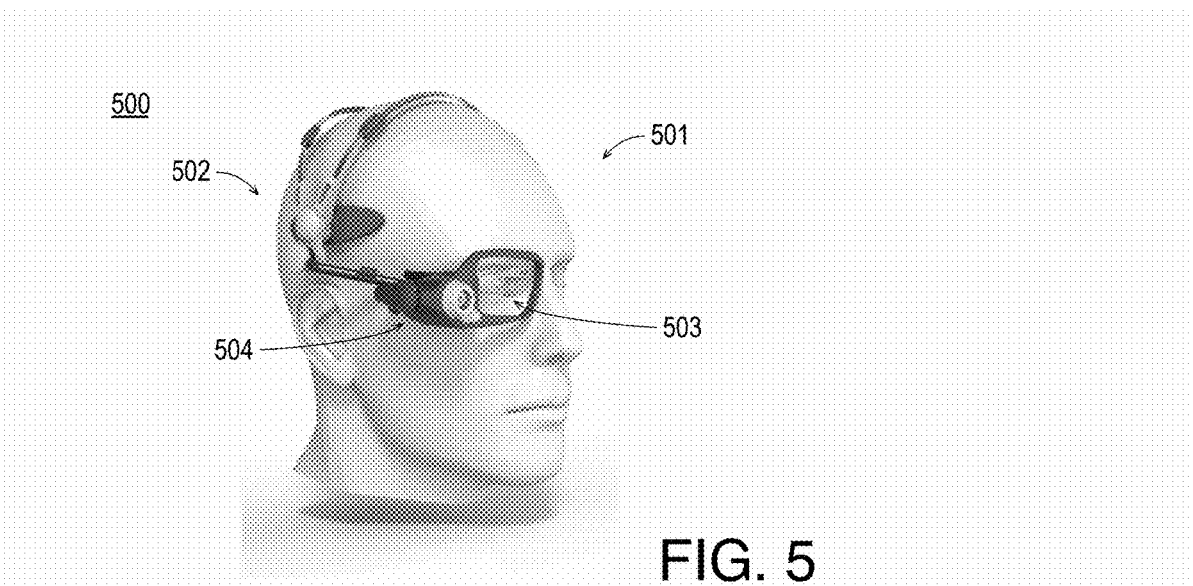
FIG. 5 is an example setting for providing an example augmented reality device.

FIG. 5 is an example setting 500 for providing an example augmented reality device 502, arranged in accordance with at least some implementations of the present disclosure. As shown in FIG. 5, setting 500 may include a user 501 interacting with and wearing augmented reality device 502 such that, during operation, user 501 may view a virtual image 503. As used herein the term virtual image refers to an image that is overlaid with respect to setting 500. As is discussed further herein with respect to systems 600, 610 below, augmented reality device 502 may include an integrated system (e.g., processor, memory, etc.) to provide image data to a micro-display with an integrated metamaterial lens. The image from the micro-display may be provided to a waveguide having holographic beam splitters on opposite ends thereof to display virtual image 503 to user 501 (e.g., over an eye of user 501). For example, micro-display with a tube shaped LED (as discussed above; e.g., one or more of micro light emitting diodes 101, 102, 103) or a vertical-cavity surface-emitting laser (VCSEL) having metasurface mirrors (as discussed below; e.g., emissive laser device 900) may be provided within package 504, which is a component of augmented reality device 502 such that augmented reality device 502 provides virtual image 503 (e.g., pertinent to while not completely obscuring the surroundings) to user 501. In the illustrated example, augmented reality device 502 is head mounted on user 501. However, augmented reality device 502 may be used by user 501 in any suitable configuration.

Figure 6A:
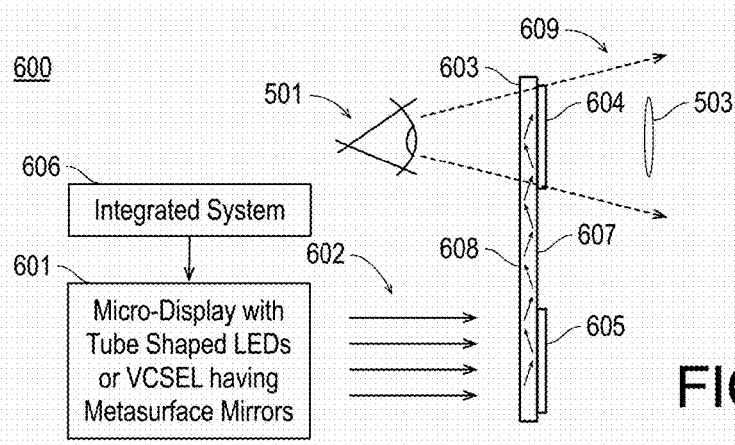
FIG. 6A is an illustrative diagram of an example system for providing a virtual image.

FIG. 6A is an illustrative diagram of an example system 600 for providing virtual image 503, arranged in accordance with at least some implementations of the present disclosure. As shown in FIG. 6A, system 600 may include a micro-display 601, a waveguide 603, a holographic beam splitter 604 and a holographic beam splitter 605 disposed on opposite ends of waveguide 603, and an integrated system 606. For example, micro-display 601 may include a tube shaped LED or a VCSEL having metasurface mirrors. In an embodiment, micro-display 601 may provide a red-green-blue projected image 602 to waveguide 603 and holographic beam splitter 605 disposed on waveguide 603. Micro-display 601 and waveguide 603 may be optically coupled such that projected image 602 is provided to waveguide. Holographic beam splitter 604 and holographic beam splitter 605 are provided on opposite ends and on a shared side 607 of waveguide 603 opposite a side 608 corresponding to the optical coupling to micro-display 601. Integrated system 606 generates virtual image data for display and micro-display 601 may receive the virtual image data and may provide projected image 602, which may enter the end of waveguide 603 having holographic beam splitter 604 via side 608 of waveguide 603 and projected image 602 may be transmitted by waveguide 603 (e.g., via internal reflection of projected image 602 inside the thickness of the glass plate of waveguide) to holographic beam splitter 605 such that virtual image 503 is provided within a field of view 609 of user 501.

Figure 6B:
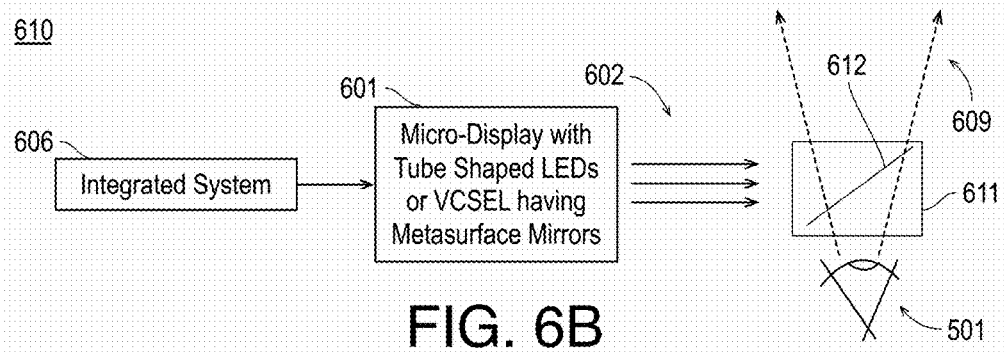
FIG. 6B is an illustrative diagram of an example system for providing a virtual image.

FIG. 6B is an illustrative diagram of an example system 610 for providing a virtual image, arranged in accordance with at least some implementations of the present disclosure. As shown in FIG. 6B, system 610 may include micro-display 601, a visual layer 611 having a prism 612, and integrated system 606. For example, micro-display 601 may include a tube shaped LED or a VCSEL having metasurface mirrors. Micro-display 601 may provide projected image 602 to visual layer 611 and prism 612 such that prism 612 projects a corresponding image to user 501. For example, visual layer 611 and prism 612 may be provided optically coupled to micro-display 601 to provide a virtual image to user 501. Integrated system 606 generates virtual image data for display, micro-display 601 may receive the virtual image data and may provide projected image 602. Projected image 602 may enter visual layer 611 and prism 612 may project the image to user 501. Furthermore, user 501 may view field of view 609 through visual layer and prism 612 such that the projected image provides an augmented reality with respect to field of view 609.

Figures 7, 8:
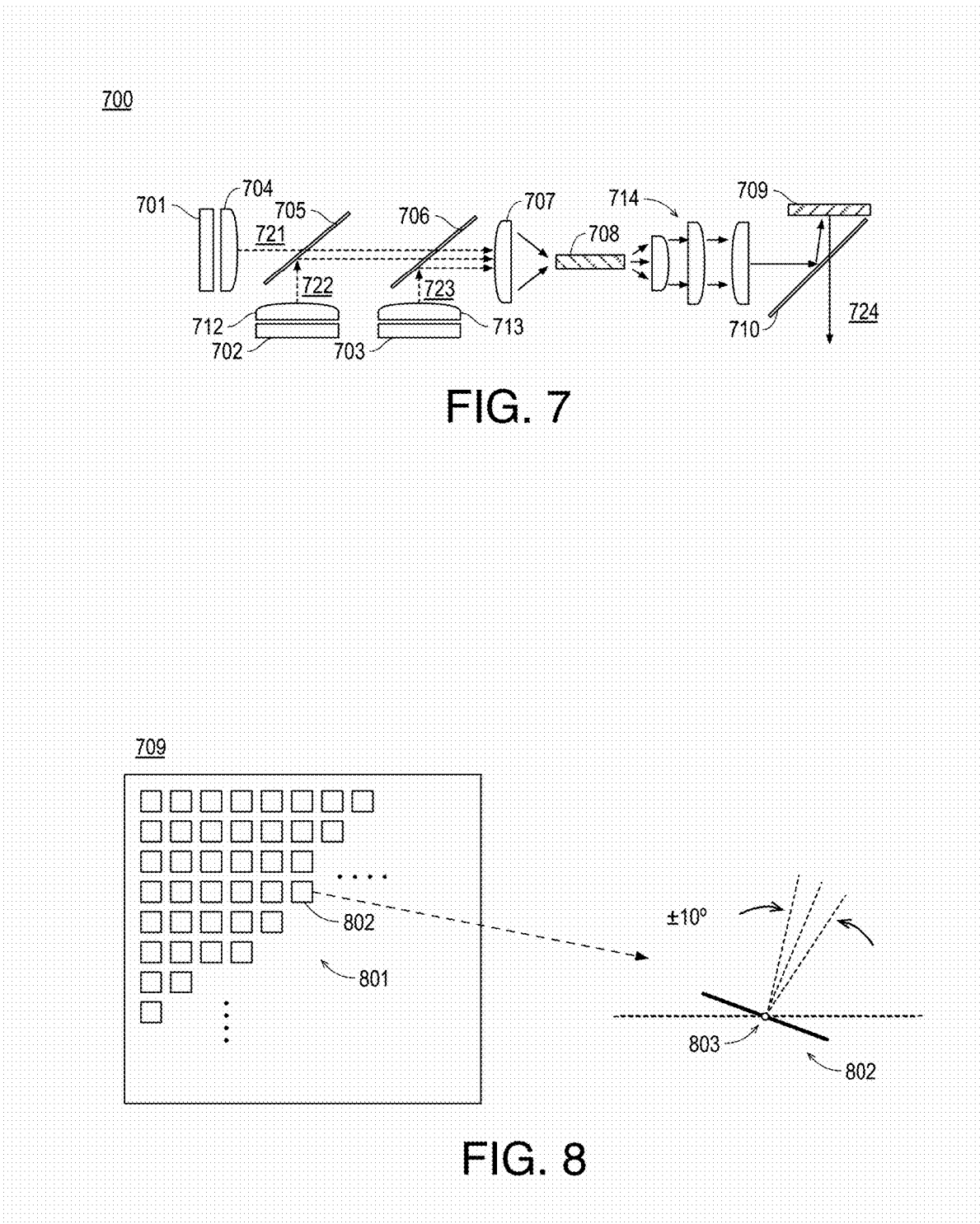
FIG. 7 illustrates an example display system utilizing red, green, and blue VCSELs.
FIG. 8 is a schematic of an example deformable micromirror device.

FIG. 7 illustrates an example display system 700 utilizing red, green, and blue VCSELs, arranged in accordance with at least some implementations of the present disclosure. As shown in FIG. 7, display system 700 may include a blue VCSEL 701, a green VCSEL 702, a red VCSEL 703, a collimating lens 704, a collimating lens 712, a collimating lens 713, a dichroic filter 705, a dichroic filter 706, a condenser lens 707, an optical integrator 708, a deformable micromirror device (DMD, also referred to as a digital micromirror device or a digital mirror device) 709, and a prism 710 to provide an output image 724 to a user. In an embodiment, display system 700 is implemented via micro-display 601. In an embodiment, one or more VCSELs having metasurface mirrors, as discussed herein below, are implemented via blue VCSEL 701, green VCSEL 702, red VCSEL 703.

As shown, blue VCSEL 701 generates blue light 721 which is collimated by collimating lens 712 and passed through dichroic filter 705 and dichroic filter 706. Green VCSEL 702 generates green light 722 which is collimated by collimating lens 712, reflected off dichroic filter 705 and passed through dichroic filter 706. Red VCSEL 703 generates red light 723 which is collimated by collimating lens 713 and reflected off dichroic filter 706. Using such techniques, each of blue light 721, green light 722, and red light 723 (or at least portions thereof as some light is invariably lost) arrive at optical integrator 708, which integrates the received light and provides integrated output to lens system 714. Lens system 714 provides the resultant light to prism 710, which reflects at least a portion of the resultant light to DMD 709, which includes an array of mirrors (as discussed herein with respect to FIG. 8), each mirror corresponding to an individual pixel element of a display. DMD 709 operates under control of a controller (not shown) to provide output image 724 based on a received image data or virtual image data such as image data generated by integrated system 606.

FIG. 8 is a schematic of an example deformable micromirror device 709, arranged in accordance with at least some implementations of the present disclosure. For example, FIG. 8 illustrates a deformable micromirror device 709 that utilizes mechanical mirrors. However, deformable micromirror device 709 may use any suitable mechanism for deflecting light. In an embodiment, DMD 709 includes an array of mirrors 801 including exemplary micromirror 802 such that each mirror of array of mirrors 801 corresponds to an individual pixel element on a display. Each mirror may be configured to tilt about an axis in response to an electrical signal applied thereto as illustrated with respect to tilt axis 803 of micromirror 802. For example, micro mirror 802 may tilt about +/−10° with respect to a plane which is perpendicular to the plane of the mirror through tilt axis 803. The corresponding projection system may be configured such that one orientation of micromirror 802 corresponds to a pixel "ON" state and the other orientation of micromirror 802 corresponds to a pixel "OFF" state. For example, the half beam angle of light striking DMD 709 may be no more than the tilt angle of the mirror (e.g., a 10° half beam angle) so that light from an OFF pixel does not enter a projection lens or is otherwise not viewable by a user. As shown in FIG. 7, an optical system or display may collect light from VCSELs having metasurface mirrors via an integrator (e.g., optical integrator 708) or the like.

Figure 9:
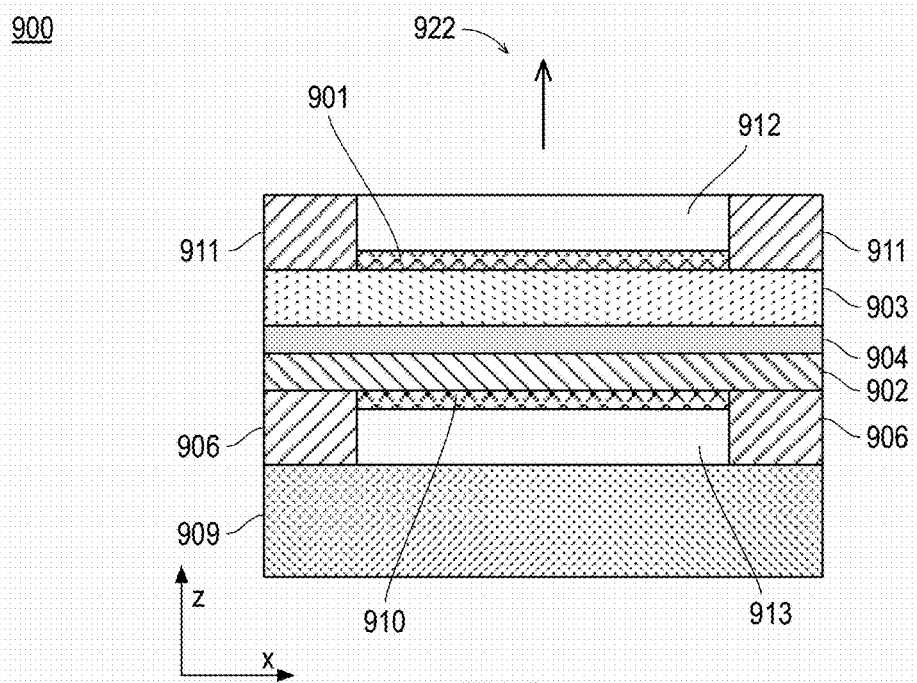
FIG. 9 illustrates an example emissive laser device.

FIG. 9 illustrates an example emissive laser device 900, arranged in accordance with at least some implementations of the present disclosure. Emissive laser device 900 may be characterized as a VCSEL, a laser, an emitter, etc. Emissive laser device 900 may emit any band of light such as a red band, a green band, a blue band, a yellow band, or even IR bands. As discussed, a band of light may have a peak at a particular wavelength such that a red band of light may include a wavelength of 630 nm, a green band of light may include a wavelength of 540 nm, and a blue band of light may include a wavelength of 470 nm. It is noted that the peak wavelength is not necessarily the wavelengths listed. As shown, emissive laser device 900 may include an emission layer 904 between a hole transport layer 902 and an electron transport layer 903, a metasurface mirror 901 adjacent to electron transport layer 903, and a metasurface mirror 910 adjacent to hole transport layer 902. For example, metasurface mirror 901 may be on electron transport layer 903 and a metasurface mirror 910 may be on hole transport layer 902. During operation, emission of light from emission layer 904 is resonantly sustained (e.g., partially contained) between metasurface mirrors 901, 910 such that metasurface mirrors 901, 910 sustain one or more resonant optical modes or wavefronts. For example, metasurface mirrors 901, 910 may be 99.99% selective to reflecting light to sustain resonance therebetween with the remaining light escaping as emitted light 922, which provides light for an emissive display as discussed herein. As shown, emissive laser device 900 may further include contacts 906 for contacting hole transport layer 902 such that contacts 906 are separated by a dielectric layer 913 (which may be characterized as an interlayer dielectric) and contacts 911 for contacting electron transport layer 903 with contacts 911 being separated by a dielectric layer 912 (which also may be characterized as an interlayer dielectric).

Emission layer 904 may include any suitable material or materials. In an embodiment, emission layer 904 includes one or more layers of indium gallium nitride (InGaN) and one or more layers of gallium nitride (GaN). In an embodiment, emission layer 904 include alternating layers of indium gallium nitride (InGaN) and gallium nitride (GaN). Emission layer 904 may be characterized as multiple quantum wells (MQW), active layers, active emission layers, or the like. As discussed below, the indium concentration in the indium gallium nitride layer(s) of emission layer 904 may be tuned to define the band of light emitted. Electron transport layer 903 may also include any suitable material or materials. In an embodiment, electron transport layer 903 includes n-doped gallium nitride (N-GaN). In an embodiment, the n-type dopant is silicon. Electron transport layer 903 may be characterized as an electron layer, an n-cladding, or the like. Hole transport layer 902 may similarly include any suitable material or materials. In an embodiment, hole transport layer 902 includes p-doped gallium nitride (P-GaN). In an embodiment, the p-type dopant is magnesium. Hole transport layer 902 may be characterized as a hole layer, a p-cladding, or the like.

In an embodiment, the particular band of light from emissive laser device 900 is effectuated by adjusting an indium concentration in the indium gallium nitride layer(s) in emission layer 904. As discussed herein, an indium concentration of about 41% in the indium gallium nitride layer(s) may provide a red color micro LED, an indium concentration of about 31% in the indium gallium nitride layer(s) may provide a green color micro LED, and an indium concentration of about 20% in the indium gallium nitride layer(s) may provide a blue color micro LED. Contacts 906 may include any suitable material such as a p-type metal contact or the like. Similarly, contacts 911 may include any suitable material such as a n-type metal contact or the like. As shown, emissive laser device 900 may include a carrier 909, which may be a wafer, a handle wafer, etc. Carrier 909 may provide physical support and/or electrical routing to contacts 906. However, emissive laser device 900 may be provided without carrier 909 such that the other components are provided on or within any suitable support structure or package.

As discussed, during operation, emission of light from emission layer 904 is resonantly sustained between metasurface mirrors 901, 910 such that metasurface mirrors 901, 910 sustain one or more resonant optical modes or wavefronts. Metasurface mirrors 901, 910 may include any suitable materials and characteristics as discussed herein to provide such resonant optical modes or wavefronts. Metasurface mirrors 901, 910 may have substantially the same characteristics or they may be different. For example, the types of metasurface mirrors may be different, the materials of the metasurface mirrors, the shapes of nanoparticles of the metasurface mirrors may be different, etc. In an embodiment, one of metasurface mirrors 901, 901 may be replaced by a conventional mirror. Furthermore, although discussed with respect to GaN material systems, emissive laser device 900 may include any suitable material system such as GaP, InP, and/or AlP material systems. For example, the emission color of emissive laser device 900 is related to the photon energy and dependent on the bandgap of the semiconductor materials used. In an embodiment, a red emissive laser device 900 may employ phosphide (Ga, In, Al)P materials. In an embodiment, blue and green emissive laser device 900 may employ nitride (Ga, In, Al)N materials.

Figure 10:
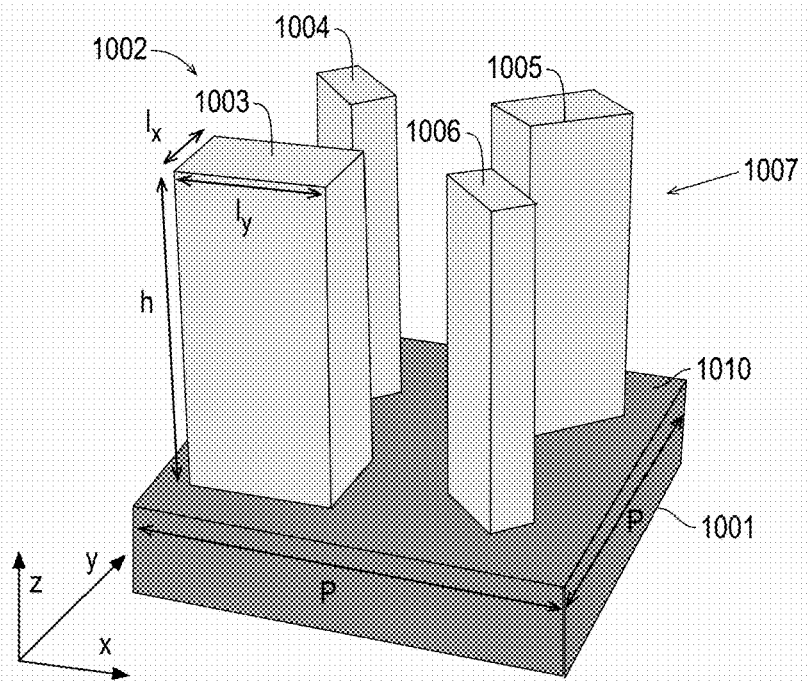
FIG. 10 illustrates an example metamaterial mirror.

FIG. 10 illustrates an example metamaterial mirror 1002, arranged in accordance with at least some implementations of the present disclosure. As shown in FIG. 10, metamaterial mirror 1002 includes nanoparticles 1003, 1004, 1005, 1006 on substrate 1001. For example, metamaterial mirror 1002 may be a metasurface fabricated by printing/depositing rectangular dielectric cuboid nanoparticles on a substrate or a light emitting device such as LED or VCSEL. In the context of FIGS. 10, 11A-11C, and 12, substrate 1001 may be any suitable surface for forming a metamaterial mirror such as an emissive surface of an emissive display element, one of hole transport layer 902 or electron transport layer 903, or a layer on or over one of hole transport layer 902 or electron transport layer 903. Metamaterial mirror 1002 of nanoparticles 1003, 1004, 1005, 1006 may be implemented in any metamaterial mirror discussed herein. For example, surface 1010 of substrate 1001 may be a surface of hole transport layer 902 or electron transport layer 903. In an embodiment, metamaterial mirror 1002 includes nanoparticles 1003, 1004, 1005, 1006 on a layer of silicon oxide or other insulator such that the layer of silicon oxide is on a surface of hole transport layer 902 or electron transport layer 903. Nanoparticles 1003, 1004, 1005 may be any suitable dielectric, semiconductor, or metal material such as one or more of silicon, titanium oxide, gallium phosphide, diamond, aluminum, or silver.

As shown in FIG. 10, nanoparticles 1003, 1004, 1005, 1006 may be rectangular cuboids having the same or varying cross-sectional dimensions and/or varying orientations. Nanoparticles 1003, 1004, 1005, 1006 may have any suitable dimensions. In an embodiment, the dimensions of nanoparticles of metamaterial mirrors may be based on the wavelength of light the metamaterial lens is controlling. In an embodiment, nanoparticles 1003, 1004, 1005, 1006 may have a height (h) of about the wavelength of light divided by two (i.e., $h \approx \lambda/2$), a first cross-sectional dimension ($l_x$) of about the wavelength of light divided by seven (i.e., $l_x \approx \lambda/7$), and a second cross-sectional dimension ($l_y$) of about the wavelength of light divided by five (i.e., $l_x \approx \lambda/5$) as illustrated with respect to nanoparticle 1003. For example, for a red VCSEL, nanoparticles 1003, 1004, 1005, 1006 may have a height (h) in the range of about 300 to 400 nanometers, a first cross-sectional dimension ($l_x$) in the range of about 80 to 100 nanometers, and a second cross-sectional dimension ($l_y$) in the range of about 120 to 150 nanometers. For a green VCSEL, nanoparticles 1003, 1004, 1005, 1006 may have a height (h) in the range of about 250 to 300 nanometers, a first cross-sectional dimension ($l_x$) in the range of about 60 to 105 nanometers, and a second cross-sectional dimension ($l_y$) in the range of about 95 to 120 nanometers. For a blue VCSEL, nanoparticles 1003, 1004, 1005, 1006 may have a height (h) in the range of about 210 to 260 nanometers, a first cross-sectional dimension ($l_x$) in the range of about 60 to 105 nanometers, and a second cross-sectional dimension ($l_y$) in the range of about 85 to 110 nanometers.

Metasurfaces such as metamaterial mirror 1002 or other metamaterial mirrors discussed herein may be considered the two-dimensional (2D) equivalent of bulk metamaterials. For example, metamaterials may be composed of periodic subwavelength metal/dielectric structures that resonantly couple to the electric and/or magnetic components of the incident electromagnetic fields, exhibiting properties that are not found in nature. Planar metamaterials with subwavelength thickness, or metasurfaces, consisting of single-layer or few-layer stacks of planar structures, may be fabricated using lithography and/or nano-printing methods, and the ultrathin thickness in the wave propagation direction may suppress undesirable losses. For example, metasurfaces enable a spatially varying optical response.

Also as shown, nanoparticles 1003-1006 may provide a repeating unit 1007 that is repeated across metasurface 1002. For example, repeating unit 1007 may have a pitch (P) of about the wavelength of light divided by two (i.e., $P \approx \lambda/2$). For example, for a red VCSEL, the pitch may be in the range of about 300 to 400 nanometers, for a green VCSEL, the pitch may be in the range of about 250 to 300 nanometers, and for a blue VCSEL, the pitch may be in the range of about 210 to 260 nanometers.

Figure 11A:
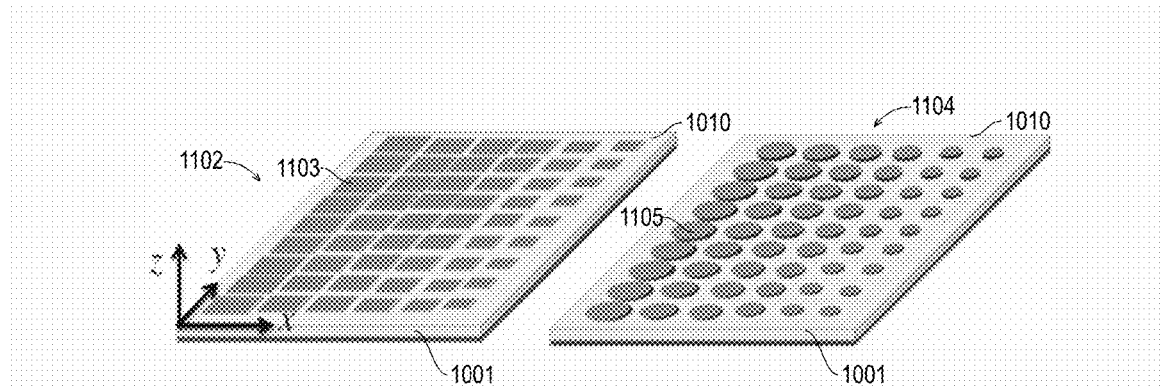
FIGS. 11A, 11B, and 11C illustrate example metamaterial mirrors.
Figure 11B:
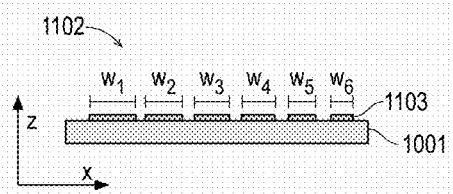
Figure 11C:
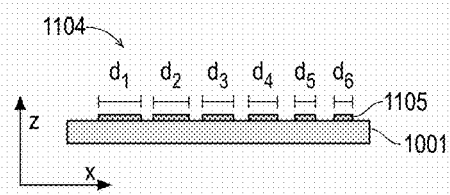

FIGS. 11A, 11B, and 11C illustrate example metamaterial mirrors, arranged in accordance with at least some implementations of the present disclosure. As shown in FIG. 11A, metamaterial mirror 1102 includes nanoparticles 1103 on a substrate 1001 and metamaterial mirror 1104 includes nanoparticles 1105 on a substrate 1001. Metamaterial mirrors 1102, 1104 may be implemented in any metamaterial mirror discussed herein. As discussed, surface 1010 of substrate 1001 may be a surface of hole transport layer 902 or electron transport layer 903. In an embodiment, metamaterial mirror 1102 includes nanoparticles 1103 on a layer of silicon oxide or other insulator such that the layer of silicon oxide is on a surface of hole transport layer 902 or electron transport layer 903. In an embodiment, metamaterial mirror 1104 includes nanoparticles 1103 on a layer of silicon oxide or other insulator such that the layer of silicon oxide is on a surface of hole transport layer 902 or electron transport layer 903. For example, metamaterial mirror 1102 and/or metamaterial mirror 1104 may provide periodic two-dimensional arrangements of nanoparticles 1103, 1105 the thickness and periodicity of which are small (e.g., 5-10 times less) compared to an implemented light wavelength. Nanoparticles 1102, 1103 may be any suitable dielectric, semiconductor, or metal material such as one or more of silicon, titanium oxide, gallium phosphide, diamond, aluminum, or silver.

As shown in FIG. 11A, metamaterial mirror 1102 includes nanoparticles 1103 having a square or rectangular cross-sectional shape (e.g., a three-dimensional cuboid shape). In an embodiment, metamaterial mirror 1102 includes nanoparticles having a variety of sizes such that nanoparticles 1103 have substantially square or rectangular cross-section and widths (e.g., $w_1$, $w_2$, $w_3$, $w_4$, $w_5$, $w_6$), please refer to FIG. 11B, or lengths (not labeled but extending in the y-direction) that vary across metamaterial mirror 1102. Such widths or lengths may be any suitable values and may be based on the wavelength of light for which they are implemented to reflect as discussed herein. For example, for a red VCSEL, nanoparticles 1103 may have lengths or widths in the range of about 110 to 150 nanometers, for a green VCSEL, nanoparticles 1103 may have lengths or widths in the range of about 45 to 120 nanometers, and for a blue VCSEL, nanoparticles 1103 may have lengths or widths in the range of about 40 to 120 nanometers. As discussed, in some embodiments, nanoparticles 1103 have a square cross-sectional shape and, in other embodiments, nanoparticles 1103 have a rectangular cross-sectional shape. Furthermore, in the illustrated embodiment, nanoparticles 1103 have varying widths and/or lengths. In an embodiment nanoparticles 1103 of metamaterial mirror 1102 are all substantially the same size.

Also as shown in FIG. 11A, metamaterial mirror 1104 includes nanoparticles 1105 having a circular or oval cross-sectional shape (e.g., nanoparticles 1105 are cylinders or elliptical cylinders). In an embodiment, metamaterial mirror 1104 includes nanoparticles having a variety of sizes such that nanoparticles 1105 have substantially circular or oval cross-section and diameters (e.g., $d_1$, $d_2$, $d_3$, $d_4$, $d_5$, $d_6$), please refer to FIG. 11C, or lengths or widths or the like that vary across metamaterial mirror 1104. Such diameters or lengths or widths may be any suitable values and may be based on the wavelength of light for which they are implemented to reflect as discussed herein. For example, for a red VCSEL, nanoparticles 1105 may have diameters or lengths or widths in the range of about 110 to 150 nanometers, for a green VCSEL, nanoparticles 1105 may have diameters or lengths or widths in the range of about 45 to 120 nanometers, and for a blue VCSEL, nanoparticles 1105 may have diameters or lengths or widths in the range of about 40 to 120 nanometers. In the illustrated embodiment, nanoparticles 1105 have varying diameters. In an embodiment nanoparticles 1105 of metamaterial mirror 1104 are all substantially the same size.

Nanoparticles 1103, 1105 may have any suitable thickness such as a thickness of about 2 to 10 times less than the wavelength of light for which they are implemented to reflect light as discussed herein. For example, for a red VCSEL, nanoparticles 1103 may have a thickness of about 110 to 400 nanometers, for a green VCSEL, nanoparticles 1103 may have a thickness of about 45 to 300 nanometers, and for a blue VCSEL, nanoparticles 1103 may have a thickness of about 40 to 270 nanometers. In an embodiment, nanoparticles 1103, 1105 have a thickness in the range of about 200 to 400 nanometers. In an embodiment, nanoparticles 1103, 1105 are high aspect ratio nanoparticles having an aspect ratio of a height of the nanoparticle to a width (or length or diameter or the like) of the nanoparticle of at least 2.5.

Figure 12:
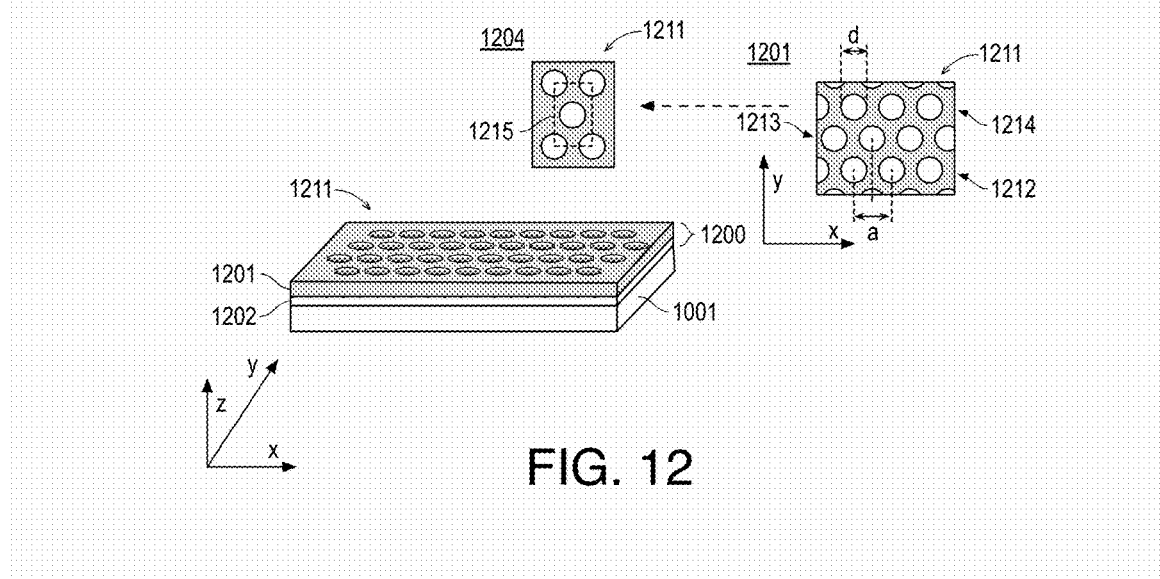
FIG. 12 illustrates an example metamaterial mirror.

FIG. 12 illustrates an example metamaterial mirror 1200, arranged in accordance with at least some implementations of the present disclosure. As shown in FIG. 12, metamaterial mirror 1200 may include a continuous layer 1202 on substrate 1001 and a patterned layer 1201 on continuous layer 1202. Continuous layer 1202 may include any suitable material such as silicon oxide. In some embodiments, continuous layer 1202 is not included and patterned layer 1201 is provided directly on substrate 1001. For example, patterned layer 1201 may provide a metamaterial mirror and may be characterized as such. As discussed, substrate 1001 may be any suitable surface for forming a metamaterial mirror such as an emissive surface of an emissive display element or one of hole transport layer 902 or electron transport layer 903. Material mirror 1200 (including continuous layer 1202 or not) may be implemented in any metamaterial mirror discussed herein. Material mirror 1200 may be any suitable dielectric, semiconductor, or metal material such as one or more of silicon, titanium oxide, gallium phosphide, diamond, aluminum, or silver.

As shown, patterned layer 1201 includes a plurality of vias 1211 that extend through both surfaces of patterned layer 1201. Vias 1211 may be characterized as through holes, holes, voids, or the like. In the illustrated embodiment, vias 1211 have a circular cross section (i.e., in the x-y plane). However, vias 1211 may have any suitable cross sectional shape such as hexagonal, square, rectangular, diamond, etc. Vias 1211 may have any suitable lateral distance (e.g., width of opening), d. In an embodiment, d is based on a particular wavelength of light emitted as discussed above. For example, a band of light to be emitted may have a peak at a particular wavelength such that a red band of light may include a wavelength of 630 nm, a green band of light may include a wavelength of 540 nm, and a blue band of light may include a wavelength of 470 nm and the peaks may be the listed wavelength or substantially similar (e.g., within 1-5% or less of the listed wavelength). In an embodiment, a band of light to be emitted has a peak at a particular wavelength and the lateral distance, d, of one or more of vias 1211 (e.g., a first via of the plurality of vias) has a lateral opening distance of not less than 10% and not more than 20% of the particular wavelength. For example, d, may be in the range of $\lambda/10$-$\lambda/5$ where $\lambda$ is the wavelength. Furthermore, a row 1212 (or column) of vias 1211 may be separated by a pitch, a, such that the pitch is also dependent on the particular wavelength. In an embodiment, the pitch, a, is not less than 25% and not more than 50% of the particular wavelength. For example, the pitch, a, may be in the range of $\lambda/4$-$\lambda/2$ where $\lambda$ is the wavelength.

In addition, vias 1211 of row 1212 may be offset or misaligned with an adjacent row 1213 of vias such that there is a half pitch (a/2) in the x-direction for vias of adjacent, misaligned rows 1213. For example, vias 1211 of row 1212 may be aligned (in the y-direction) with vias of alternating rows as illustrated with respect to row 1214. Such patterning is also evident in the columns of vias 1211. As illustrated with respect to detail 1204, vias 1211 of patterned layer 1201 may have a repeating pattern 1215 having a rectangular shape with a via centered at each vertex thereof and a via centered within the rectangular shape. Although illustrated with respect to repeating pattern 1215, vias 1211 of patterned layer 1201 may have any suitable pattern such that the discussed reflectance is provided.

Figure 13:
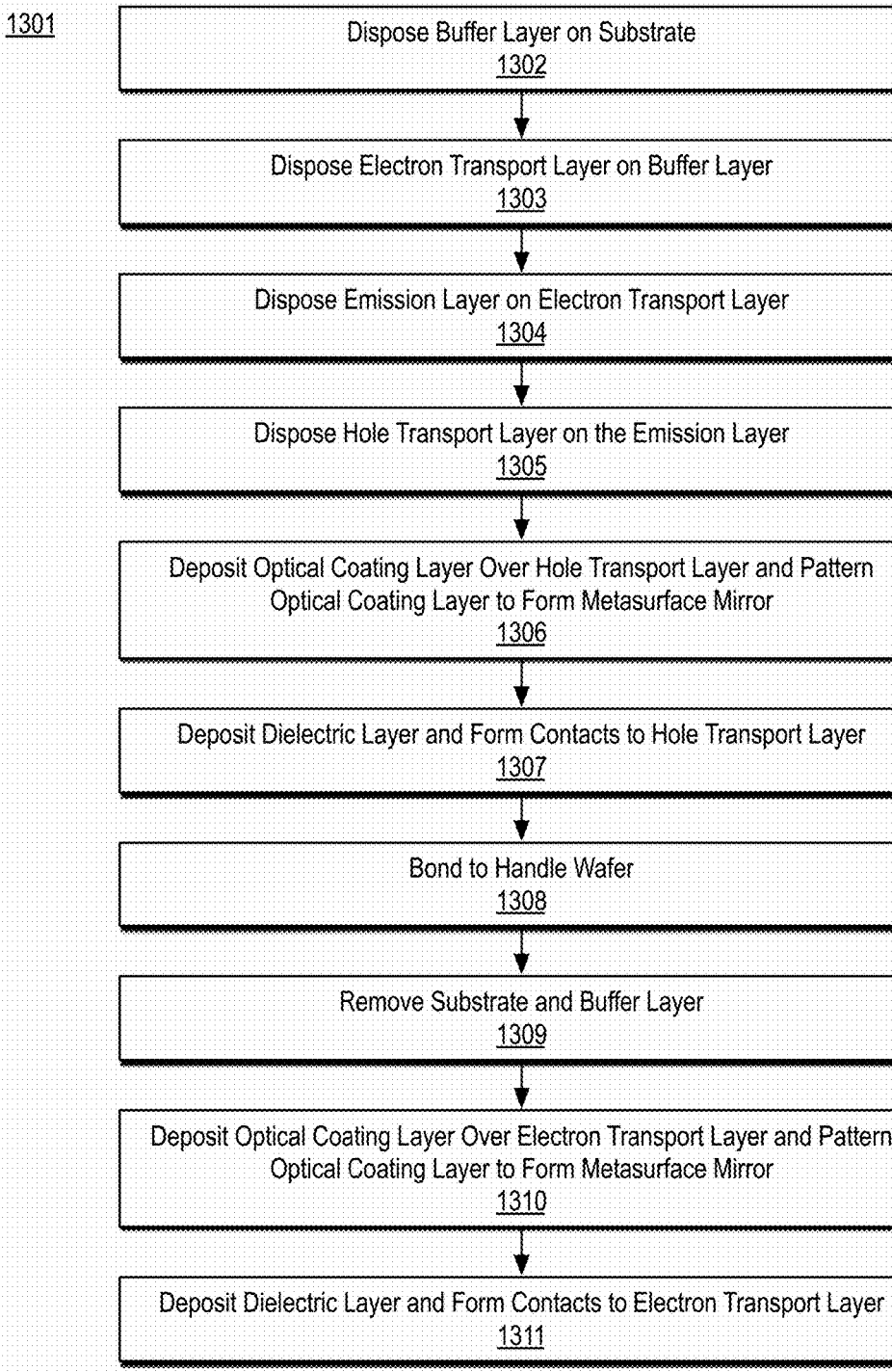
FIG. 13 is a flow diagram illustrating an example process for fabricating an emissive laser device.

FIG. 13 is a flow diagram illustrating an example process 1301 for fabricating an emissive laser device, arranged in accordance with at least some implementations of the present disclosure. For example, process 1301 may be implemented to fabricate any suitable emissive laser device or VCSEL discussed herein such as emissive laser device 900. In the illustrated implementation, process 1301 may include one or more operations as illustrated by operations 1302-1311. However, embodiments herein may include additional operations, certain operations being omitted, or operations being performed out of the order provided.

Process 1301 may begin at operation 1302, where a buffer layer is disposed on a substrate. The substrate may include any suitable materials or layers such as a sapphire wafer. The buffer layer may include any suitable material such as AlN/GaN or the like. The buffer layer may be formed using any suitable technique or techniques such as metal-organic chemical vapor deposition, metal-organic vapor phase epitaxy, epitaxial growth, or the like. In an embodiment, buffer layer 1403 is disposed on substrate 1402 as discussed with respect to FIG. 14A.

Process 1301 may continue at operation 1303, where an electron transport layer may be disposed on the buffer layer. The electron transport layer may be disposed on the buffer layer using any suitable technique or techniques such as metal-organic chemical vapor deposition, metal-organic vapor phase epitaxy, epitaxial growth, or the like. In an embodiment, the electron transport layer may be disposed using deposition with hydrazine providing the nitrogen for n-doped gallium nitride growth at a temperature of not more than 700° C. In an embodiment, electron transport layer 903 is disposed on buffer layer 1403 as discussed with respect to FIG. 14A.

Process 1301 may continue at operation 1304, where an emission layer may be disposed on the electron transport layer. The emission layer may be disposed on the electron transport layer using any suitable technique or techniques such as metal-organic chemical vapor deposition, metal-organic vapor phase epitaxy, epitaxial growth, or the like. In an embodiment, the emission layer may be disposed on the electron transport layer with hydrazine providing the nitrogen for alternating gallium nitride growth and indium gallium growth at a temperature of not more than 700° C. As discussed the indium concentration may be used to determine the resultant light from the emissive laser device. In an embodiment, emission layer 904 is disposed on electron transport layer 903 as discussed with respect to FIG. 14A.

Process 1301 may continue at operation 1305, where a hole transport layer may be disposed on the emission layers. The hole transport layer may be disposed on the emission layers using any suitable technique or techniques such as metal-organic chemical vapor deposition, metal-organic vapor phase epitaxy, epitaxial growth, or the like. In an embodiment, the hole transport layer may be disposed on the emission layers with hydrazine providing the nitrogen for p-doped gallium nitride growth at a temperature of not more than 700° C. In an embodiment, hole transport layer 902 may be disposed on emission layers 904 as discussed herein with respect to FIG. 14A.

Process 1301 may continue at operation 1306, where an optical coating is deposited on the hole transport layer and the optical coating is patterned to form a metasurface mirror. The optical coating may include any suitable material for implementation of a metasurface mirror and the optical coating may be deposited using any suitable technique or techniques. Furthermore, the optical coating may be patterned using any suitable technique or techniques such as lithography and etch techniques or nano-print techniques. In an embodiment, metasurface mirror 910 may be formed on hole transport layer 902 as discussed herein with respect to FIG. 14B.

For example, metasurface mirrors may be formed using any suitable technique or techniques. In an embodiment, to fabricate a metasurface, processing begins with a flat surface, and the surface is decorated with nanoparticles. Such nanoparticles may alter the phase of light as it passes through or reflects, creating a new wavefront. Achieving control over the phase of light may require precise, high-aspect-ratio nanostructures. Such require precise, high-aspect-ratio nanostructures may be formed using nanofabrication techniques. In some embodiments, Pancharatnam-Berry phase theory may be used to design planar optical components using metasurfaces with spatially varying polarization response. For example, the orientation of all-dielectric (e.g. Si, GaP or $TiO_2$) rectangular cuboid ($\phi$) may determine the phase delay associated with the transmitted light (e.g., $\Phi=2\phi$).

Process 1301 may continue at operation 1307, where a dielectric layer may be deposited on the metasurface mirror and contacts may be formed to contact the hole transport layer. The dielectric layer and contacts may be formed using any suitable technique or techniques such as deposition and etch techniques. In an embodiment, a bulk layer of contact material is deposited and patterned to form the contacts and the dielectric layer is subsequently formed using deposition and planarization techniques. In an embodiment, contacts 906 and dielectric layer 913 may be formed as discussed herein with respect to FIG. 14C.

Process 1301 may continue at operation 1308, where the structure formed at operation 1307 may be bonded, via a side having the contacts and dielectric layer, to a handle wafer. The handle wafer bonding may be performed using any suitable technique or techniques such as direct bonding, surface activated bonding, adhesive bonding, or the like. In an embodiment, handle wafer or carrier 909 is bonded as discussed herein with respect to FIG. 14D. Process 1301 may continue at operation 1309, where the substrate and buffer layer may be removed. The substrate may be removed to expose the buffer layer using any suitable technique or techniques such as laser lift off removal (e.g., UV laser lift-off). The buffer layer may be removed using any suitable technique or techniques such as wet or dry etch techniques. In an embodiment, substrate 1402 and buffer layer 1403 are removed as discussed herein with respect to FIGS. 14E and 14F.

Process 1301 may continue at operation 1310, where an optical coating is deposited on the electron transport layer and the optical coating is patterned to form a metasurface mirror. The optical coating may include any suitable material for implementation of a metasurface mirror and the optical coating may be deposited using any suitable technique or techniques. Furthermore, the optical coating may be patterned using any suitable technique or techniques such as lithography and etch techniques or nano-print techniques. In an embodiment, metasurface mirror 901 may be formed on electron transport layer 903 as discussed herein with respect to FIG. 14G.

Process 1301 may continue at operation 1311, where a dielectric layer may be deposited on the metasurface mirror and contacts may be formed to contact the electron transport layer. The dielectric layer and contacts may be formed using any suitable technique or techniques such as deposition and etch techniques. In an embodiment, a bulk layer of contact material is deposited and patterned to form the contacts and the dielectric layer is subsequently formed using deposition and planarization techniques. In an embodiment, contacts 911 and dielectric layer 912 may be formed as discussed herein with respect to FIG. 14H.

Figure 14A:
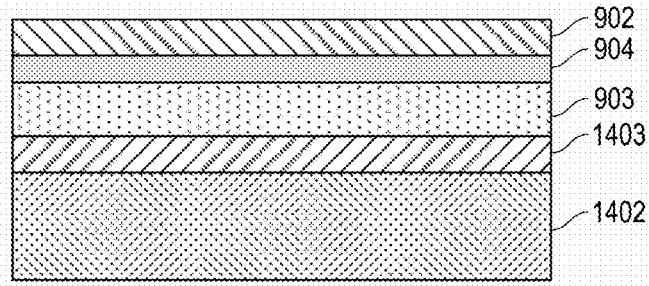
FIGS. 14A, 14B, 14C, 14D, 14E, 14F, 14G, and 14H are cross-sectional views of example emissive laser device structures as particular fabrication operations are performed.

FIGS. 14A, 14B, 14C, 14D, 14E, 14F, 14G, and 14H are cross-sectional views of example emissive laser device structures as particular fabrication operations are performed, arranged in accordance with at least some implementations of the present disclosure. FIG. 14A illustrates a cross-sectional view of an emissive laser device structure 1401, which includes substrate 1402, buffer layer 1403, electron transport layer 903, emission layer 904, and hole transport layer 902. For example, substrate 1402 may be any carrier or substrate as discussed herein such as a sapphire substrate or wafer. Buffer layer 1403, electron transport layer 903, emission layer 904, and hole transport layer 902 may be formed using any suitable technique or techniques. For example, buffer layer 1403, electron transport layer 903, emission layer 904, and hole transport layer 902 may be deposited and/or grown using epitaxial growth techniques.

Figure 14B:
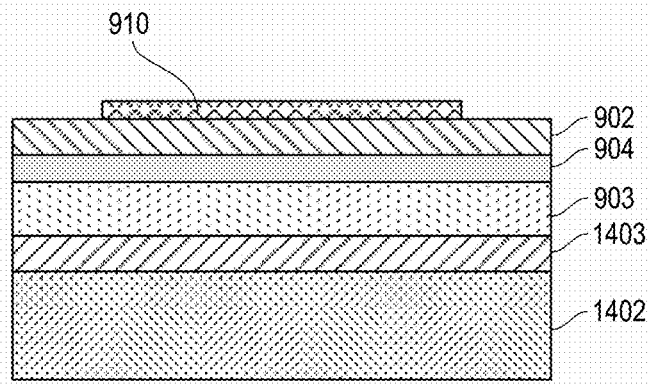
Figure 14C:
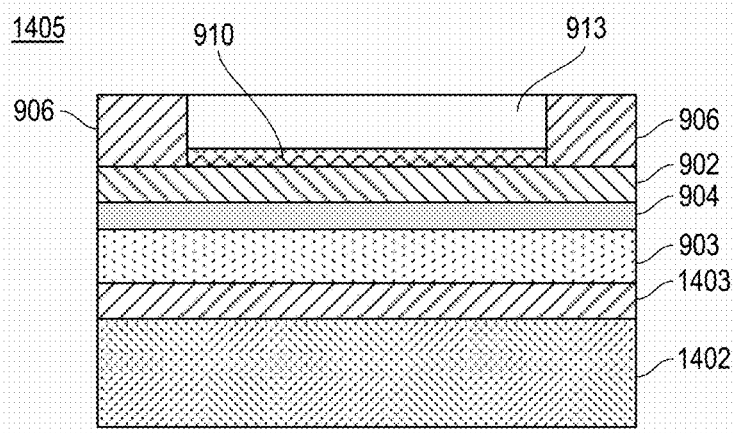

FIG. 14B illustrates an emissive laser device structure 1404 similar to emissive laser device structure 1401, after the formation of metasurface mirror 910. Metasurface mirror 910 may be formed using any suitable technique or techniques discussed herein such as lithography or nano-print techniques as discussed herein. FIG. 14C illustrates an emissive laser device structure 1405 similar to emissive laser device structure 1404, after the formation of contacts 906 and dielectric layer 913. Contacts 906 and dielectric layer 913 may be formed using any suitable technique or techniques. In an embodiment, a bulk contact material may be deposited and patterned to form contacts 906 and a bulk dielectric layer may be deposited and polished to form dielectric layer 913.

Figure 14D:
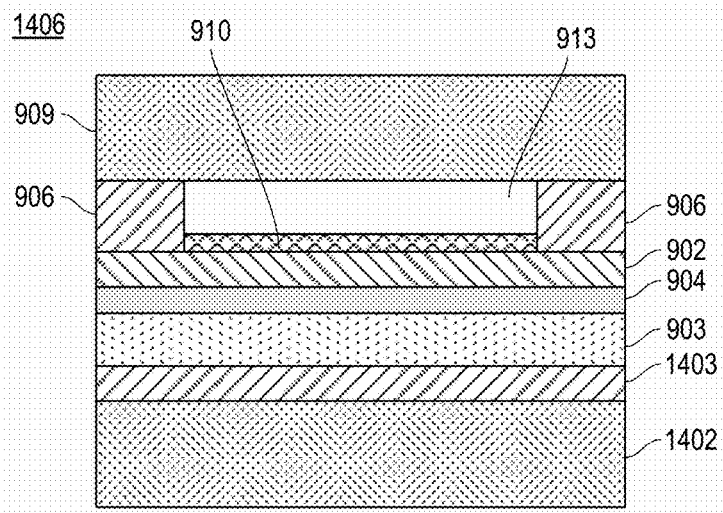
Figure 14E:
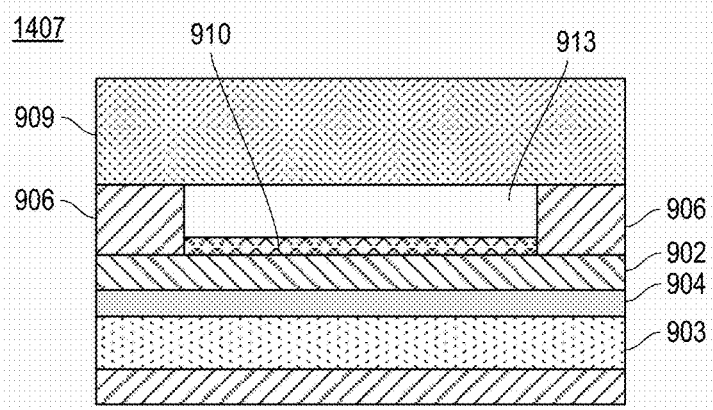
Figure 14F:
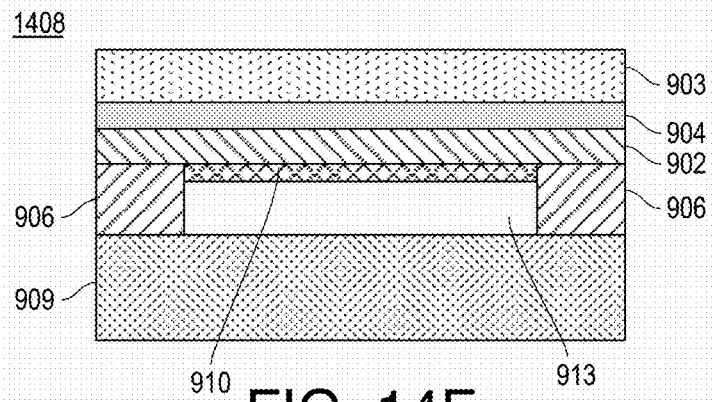

FIG. 14D illustrates an emissive laser device structure 1406 similar to emissive laser device structure 1405, after bonding to carrier 909. Emissive laser device structure 1405 may be bonded to carrier 909 using any suitable technique or techniques such as direct bonding, surface activated bonding, adhesive bonding, or the like. FIG. 14E illustrates an emissive laser device structure 1407 similar to emissive laser device structure 1406, after the removal of substrate 1402. Substrate 1402 may be removed using any suitable technique or techniques such as laser lift off removal (e.g., UV laser lift off). FIG. 14F illustrates an emissive laser device structure 1408 similar to emissive laser device structure 1407, after the removal of buffer layer 1403. It is also noted that emissive laser device structure 1408 is flipped over with respect to emissive laser device structure 1407. Buffer layer 1403 may be removed using any suitable technique or techniques such as such as wet or dry etch techniques.

Figure 14G:
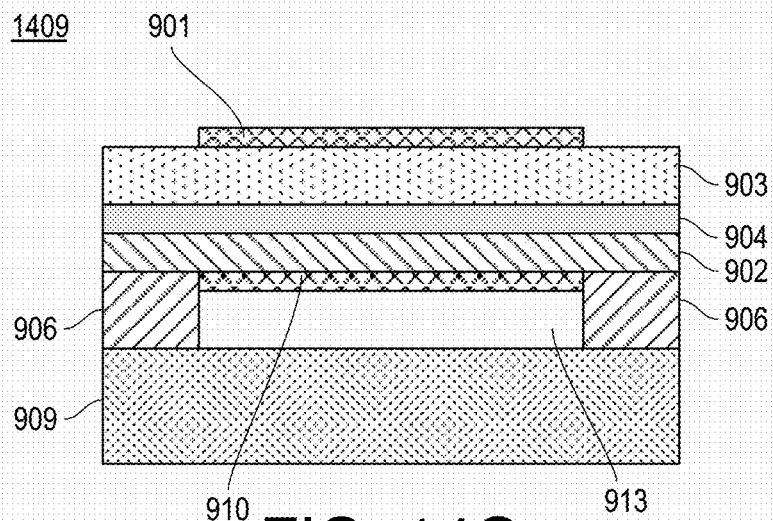
Figure 14H:
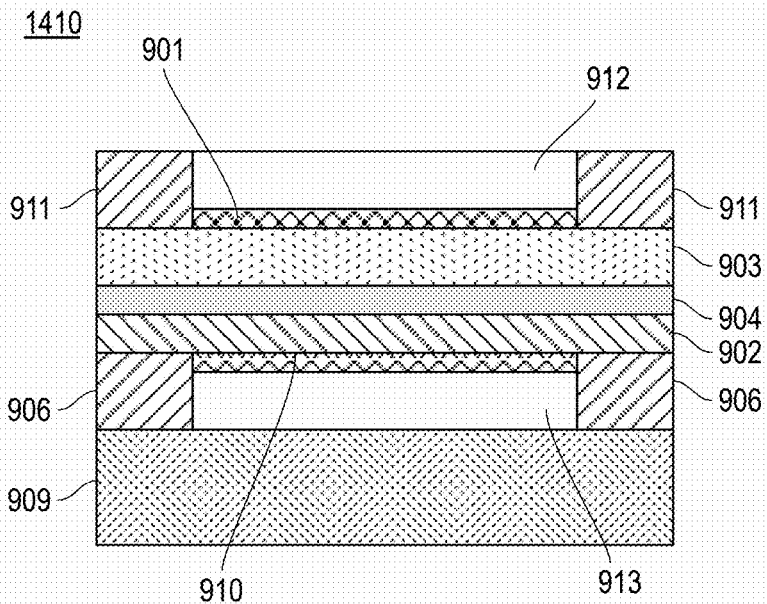

FIG. 14G illustrates an emissive laser device structure 1409 similar to emissive laser device structure 1408, after the formation of metasurface mirror 901. Metasurface mirror 901 may be formed using any suitable technique or techniques discussed herein such as lithography or nanoprint techniques as discussed herein. FIG. 14H illustrates an emissive laser device structure 1410 similar to emissive laser device structure 1409, after the formation of contacts 911 and dielectric layer 912. Contacts 911 and dielectric layer 912 may be formed using any suitable technique or techniques. In an embodiment, a bulk contact material may be deposited and patterned to form contacts 911 and a bulk dielectric layer may be deposited and polished to form dielectric layer 912. With reference to FIG. 9, emissive laser device structure 1410 may have the same structure as emissive laser device 900 and any characteristics discussed herein may be shared therebetween.

Figure 15:
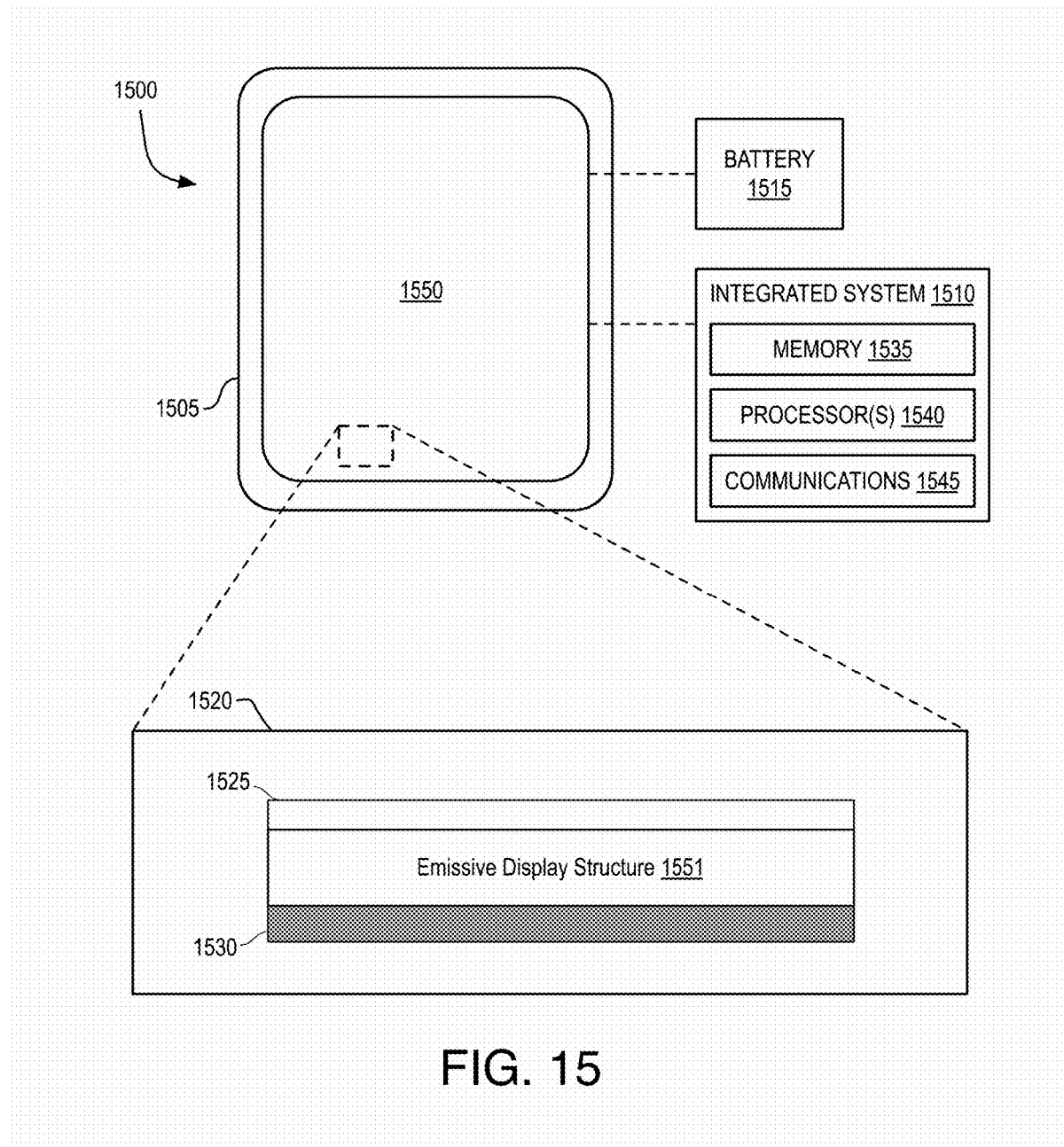
FIG. 15 illustrates a system in which a mobile computing platform employs an emissive display device structure.

FIG. 15 illustrates a system 1500 in which a mobile computing platform 1505 employs an emissive display device structure 1551, arranged in accordance with at least some implementations of the present disclosure. Emissive display device structure 1551 may include an emissive display device discussed herein such as a VCSEL, a micro LED, or the like. Mobile computing platform 1505 may be any portable device configured for each of electronic data display, electronic data processing, wireless electronic data transmission, or the like. For example, although illustrated as a tablet, mobile computing platform 1505 may be any of a tablet, a smartphone, a phablet, a laptop computer, a watch, an augmented reality device, a virtual reality device, a headset etc., and may include a display device 1550 employing an emissive display device structure such as emissive display device structure 1551 as illustrated in expanded view 1520.

Also as illustrated in expanded view 1520, display device 1550 may include a glass front plate 1525 and a back plane or plate 1530. For example, glass front plate 1525 may be disposed adjacent to emissive display device structure 1551 and may provide protection for components of emissive display device structure 1551 and a monolithic display structure for a viewer of display device 1550. Back plane 1530 may similarly provide a monolithic structure for implementing and/or housing emissive display device structure 1551 and/or other components of display device 1550. In an embodiment, a driver circuit is implemented via backplane 1530. Furthermore, glass front plate 1525 and/or back plane 1530 may provide components of and/or be provided within a housing of system 1500.

As discussed, emissive display device structure 1551 may include any suitable emissive display device discussed herein such as any of micro light emitting diodes 101, 102, 103 or emissive laser device 900 or components thereof. Furthermore, display device 1550 may provide touch capability via a capacitive, inductive, resistive, or optical touchscreen. Also as shown, mobile computing platform 1505 includes a chip-level or package-level integrated system 1510 and a battery 1515. Although illustrated with respect to mobile computing platform 1505, the emissive display device structures discussed herein may also be employed via a display of a desktop computer, television, or the like.

Integrated system 1510 may be implemented as discrete components (e.g., integrated circuits) or as a system on a chip and may include may include memory circuitry 1535 (e.g., random access memory, storage, etc.), processor circuitry 1540 (e.g., a microprocessor, a multi-core microprocessor, graphics processor, etc.), and communications circuitry 1545 (e.g., a wireless transceiver, a radio frequency integrated circuit, a wideband RF transmitter and/or receiver, etc.). The components of integrated system 1510 may be communicatively coupled to one another for the transfer of data within integrated system 1510. Functionally, memory circuitry 1535 may provide memory and storage for integrated system 1510 including image and/or video data for display by display device 1550, processor circuitry 1540 may provide high level control for mobile computing platform 1505 as well as operations corresponding to generating image and/or video data for display by display device 1550, and communications circuitry 1545 may transmit and/or receive data including image and/or video data for display by display device 1550. For example, communications circuitry 1545 may be coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 16:
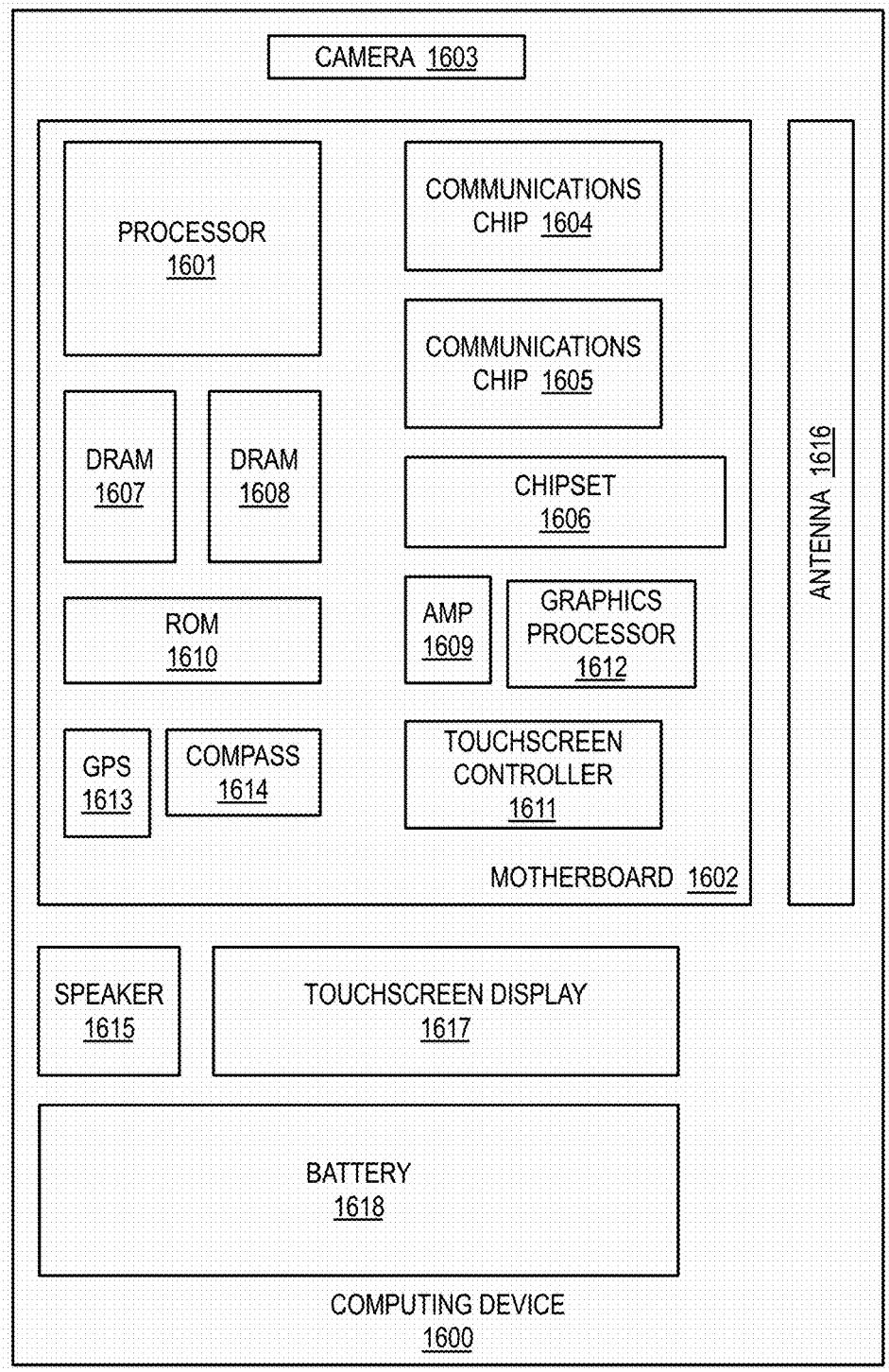
FIG. 16 is a functional block diagram of a computing device, all arranged in accordance with at least some implementations of the present disclosure.

FIG. 16 is a functional block diagram of a computing device 1600, arranged in accordance with at least some implementations of the present disclosure. Computing device 1600 or portions thereof may be implemented via or mobile computing platform, for example, and further includes a motherboard 1602 hosting a number of components, such as, but not limited to, a processor 1601 (e.g., an applications processor, a microprocessor, etc.) and one or more communications chips 1604, 1605. Processor 1601 may be physically and/or electrically coupled to motherboard 1602. In some examples, processor 1601 includes an integrated circuit die packaged within the processor 1601. In general, the term "processor" may refer to any device or portion of a device that processes electronic data from registers and/or memory to transform that electronic data into other electronic data that may be stored in registers and/or memory.

In various examples, one or more communication chips 1604, 1605 may also be physically and/or electrically coupled to the motherboard 1602. In further implementations, communication chips 1604 may be part of processor 1601. Depending on its applications, computing device 1600 may include other components that may or may not be physically and electrically coupled to motherboard 1602. These other components may include, but are not limited to, volatile memory (e.g., DRAM) 1607, 1608, non-volatile memory (e.g., ROM) 1610, a graphics processor 1612, flash memory, global positioning system (GPS) device 1613, compass 1614, a chipset 1606, an antenna 1616, a power amplifier 1609, a touchscreen controller 1611, a touchscreen display 1617, a speaker 1615, a camera 1603, and a battery 1618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. For example, touchscreen display 1617 may implement any emissive devices discussed herein.

Communication chips 1604, 1605 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1604, 1605 may implement any of a number of wireless standards or protocols, including but not limited to those described elsewhere herein. As discussed, computing device 1600 may include a plurality of communication chips 1604, 1605. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, one or both of communication chips 1604, 1605 may provide a wireless transceiver for computing device 1600. As discussed, touchscreen display 1617 of computing device 1600 may include or utilize one or more emissive devices discussed herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A light emitting diode device comprising:
an electron transport layer core, wherein the electron transport layer core comprises a tube shape having an inner sidewall and an outer sidewall;
an emission layer immediately adjacent to both the inner and outer sidewalls; and
a hole transport layer immediately adjacent to the emission layer.

2. The light emitting diode device of claim 1, further comprising:
a second electron transport layer core, wherein the second electron transport layer core comprises a tube shape having a second inner sidewall and a second outer sidewall;
a second emission layer immediately adjacent to both the second inner and outer sidewalls; and
a second hole transport layer immediately adjacent to the second emission layer, wherein an inner diameter of the electron transport layer core and a second inner diameter of the second electron transport core differ by not less than 20%.

3. The light emitting diode device of claim 2, wherein an inner diameter of the electron transport layer core is not less than 80 nm and not more than 100 nm and a width of the electron transport layer core between the inner and outer sidewalls is not less than 140 nm and not more than 220 nm.

4. The light emitting diode device of claim 3, further comprising:
a continuous dielectric layer extending between the electron transport layer core and the second electron transport layer core.

5. The light emitting diode device of claim 1, further comprising:
a second electron transport layer core, wherein the second electron transport layer core comprises a tube shape having a second inner sidewall and a second outer sidewall;
a second emission layer immediately adjacent to both the second inner and outer sidewalls;
a second hole transport layer immediately adjacent to the second emission layer;
a third electron transport layer core, wherein the third electron transport layer core comprises a tube shape having a third inner sidewall and a third outer sidewall;
a third emission layer immediately adjacent to both the third inner and outer sidewalls; and
a third hole transport layer immediately adjacent to the third emission layer, wherein an inner diameter of the electron transport layer is not less than 80 nm and not more than 100 nm and the emission layer is to emit blue light, an inner diameter of the second electron transport layer is not less than 140 nm and not more than 160 nm and the second emission layer is to emit green light, and an inner diameter of the third electron transport layer is not less than 200 nm and not more than 220 nm and the third emission layer is to emit red light.

6. The light emitting diode device of claim 1, further comprising:
a reflective cladding disposed over the hole transport layer, wherein the electron transport layer core comprises n-type doped gallium nitride, the emission layer comprises a multi quantum well comprising indium gallium nitride and gallium nitride layers, and the hole transport layer comprises p-type doped gallium nitride or p-type zinc oxide.

7. The light emitting diode device of claim 6, further comprising:
a conductive contact over a backplane, wherein the reflective cladding is coupled to the conductive contact.

8. The light emitting diode device of claim 7, further comprising:

a transparent electrode electrically coupled to the electron transport layer core; and a display glass front plate over the transparent electrode.

9. The light emitting diode device of claim 1, further comprising:

a dielectric layer between the electron transport layer core and the hole transport layer.

10. A method of fabricating a light emitting diode device comprising disposing an electron transport layer core within a trench of a patterned layer over a substrate, wherein the electron transport layer core comprises a tube shape having an inner sidewall and an outer sidewall;

removing at least a portion of the patterned layer to expose at least a portion of the inner sidewall and at least a portion of the outer sidewall;

disposing an emission layer on both the portion of the inner sidewall and the portion of the outer sidewall; and disposing a hole transport layer on the emission layer.

11. The method of fabricating the light emitting diode device of claim 10, wherein disposing the emission layer comprises chemical vapor deposition using hydrazine as a nitrogen source.

12. The method of fabricating the light emitting diode device of claim 11, wherein disposing the emission layer comprises disposing the emission layer at a temperature of not more than 700° C.

13. The method of fabricating the light emitting diode device of claim 10, wherein said disposing the electron transport layer core further comprises disposing a second electron transport layer core within a second trench of the patterned layer, wherein the second electron transport layer core comprises a tube shape having a second inner sidewall and a second outer sidewall, and wherein an inner diameter of the electron transport layer core and a second inner diameter of the second electron transport core differ by not less than 20%.

14. The method of fabricating the light emitting diode device of claim 10, wherein said disposing the electron transport layer core comprises a concurrent epitaxy process to further dispose a second electron transport layer core within a second trench of the patterned layer and a third electron transport layer core within a third trench of the patterned layer, wherein the second electron transport layer core comprises a tube shape having a second inner sidewall and a second outer sidewall and the third electron transport layer core comprises a tube shape having a third inner sidewall and a third outer sidewall, and wherein an inner diameter of the electron transport layer is not less than 80 nm and not more than 100 nm, an inner diameter of the second electron transport layer is not less than 140 nm and not more than 160 nm, and an inner diameter of the third electron transport layer is not less than 200 nm and not more than 220 nm.

15. The method of fabricating the light emitting diode device of claim 10, further comprising:

disposing a reflective cladding over the hole transport layer;

coupling the reflective cladding to a conductive contact over a backplane; and removing the substrate from the electron transport layer core.

* * * * *